United States Patent
Nakazawa

(10) Patent No.: US 8,629,035 B2
(45) Date of Patent: Jan. 14, 2014

(54) METHOD OF MANUFACTURING SEMICONDUCTOR DEVICE

(75) Inventor: Keisuke Nakazawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/409,401

(22) Filed: Mar. 1, 2012

(65) Prior Publication Data
US 2013/0102124 A1    Apr. 25, 2013

(30) Foreign Application Priority Data
Oct. 20, 2011 (JP) .................. 2011-230795

(51) Int. Cl.
H01L 21/764 (2006.01)

(52) U.S. Cl.
USPC ..... 438/411; 438/421; 438/422; 257/E21.573

(58) Field of Classification Search
USPC ........... 438/411, 421, 422; 257/E21.573
See application file for complete search history.

(56) References Cited

U.S. PATENT DOCUMENTS

| | | | | |
|---|---|---|---|---|
| 5,098,856 A * | 3/1992 | Beyer et al. | ..... | 438/422 |
| 5,324,683 A * | 6/1994 | Fitch et al. | ..... | 438/422 |
| 5,510,645 A * | 4/1996 | Fitch et al. | ..... | 257/522 |
| 5,668,398 A * | 9/1997 | Havemann et al. | ..... | 257/522 |
| 6,071,805 A * | 6/2000 | Liu | ..... | 438/619 |
| 6,127,241 A * | 10/2000 | Rha | ..... | 438/437 |
| 6,165,843 A * | 12/2000 | Sung | ..... | 438/258 |
| 6,261,942 B1 * | 7/2001 | Zhou et al. | ..... | 438/619 |
| 6,268,262 B1 * | 7/2001 | Loboda | ..... | 438/422 |
| 6,268,637 B1 * | 7/2001 | Gardner et al. | ..... | 257/522 |
| 6,376,893 B1 * | 4/2002 | Rha | ..... | 257/522 |
| 6,406,975 B1 * | 6/2002 | Lim et al. | ..... | 438/421 |
| 6,413,827 B2 * | 7/2002 | Farrar | ..... | 438/296 |
| 6,727,157 B2 * | 4/2004 | Seo | ..... | 438/421 |
| 6,734,095 B2 * | 5/2004 | Leuschner et al. | ..... | 438/619 |
| 6,780,721 B2 * | 8/2004 | Farrar | ..... | 438/296 |
| 6,921,704 B1 * | 7/2005 | Wu et al. | ..... | 438/421 |
| 7,396,732 B2 * | 7/2008 | Kunnen | ..... | 438/322 |
| 7,407,864 B2 | 8/2008 | Kawasaki et al. | | |
| 7,560,344 B2 * | 7/2009 | Kim et al. | ..... | 438/270 |
| 7,781,341 B2 | 8/2010 | Nakazawa | | |
| 8,211,777 B2 * | 7/2012 | Yonemochi et al. | ..... | 438/422 |
| 2008/0090988 A1 | 4/2008 | Nakazawa et al. | | |
| 2010/0190317 A1 | 7/2010 | Iwasawa et al. | | |
| 2010/0311220 A1 | 12/2010 | Matsuo et al. | | |
| 2011/0127650 A1 * | 6/2011 | Witvrouw et al. | ..... | 257/622 |

FOREIGN PATENT DOCUMENTS

JP    2007-250656    9/2007
JP    2010-27922    2/2010

OTHER PUBLICATIONS

Nakazawa, U.S. Appl. No. 13/309,730, filed Dec. 2, 2011.
Nakazawa, U.S. Appl. No. 13/425,592, filed Mar. 21, 2012.

* cited by examiner

*Primary Examiner* — Mary Wilczewski
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming an isolation trench in a substrate, and forming an amorphous layer on a sidewall surface of the isolation trench. The method further includes forming a sacrificial layer in the isolation trench via the amorphous layer, and forming an air gap layer on the sacrificial layer. The method further includes forming an air gap in the isolation trench under the air gap layer by removing the sacrificial layer after forming the air gap layer.

52 Claims, 26 Drawing Sheets

A-A' SECTION

B-B' SECTION

A-A' SECTION

B-B' SECTION

FIG.8A
FIG.8B  A–A′ SECTION
FIG.8C  B–B′ SECTION
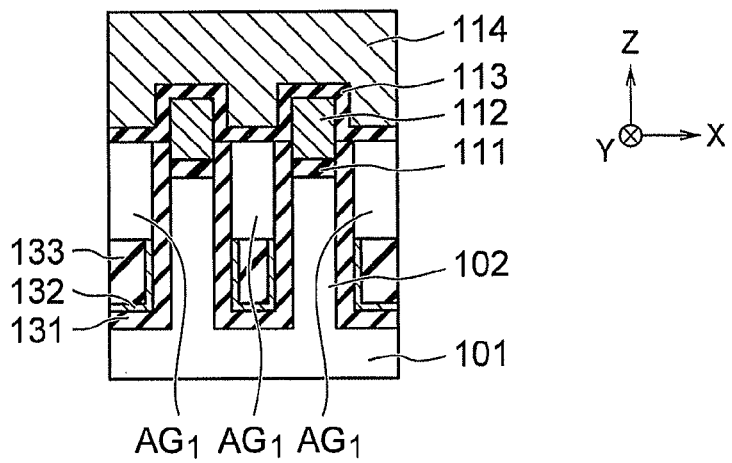
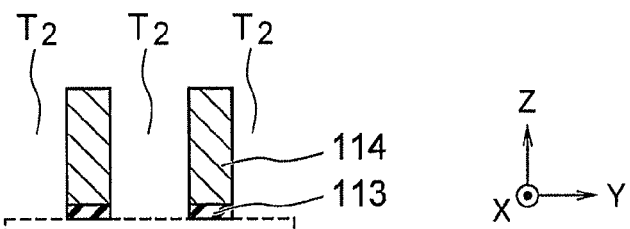
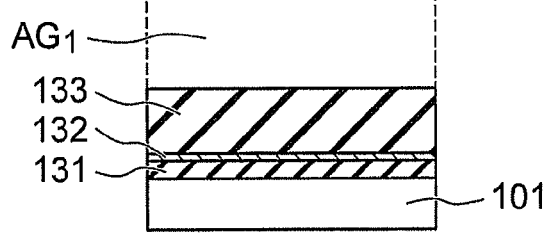
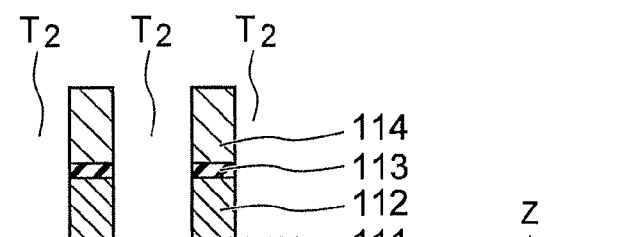

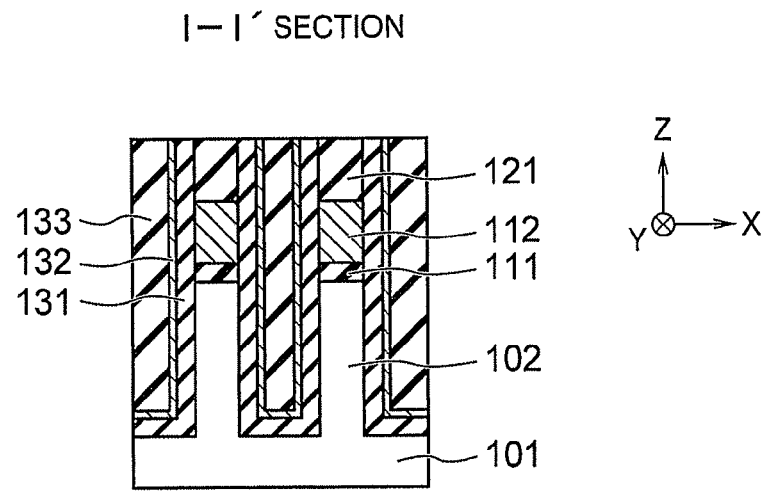
FIG. 15A  I-I' SECTION
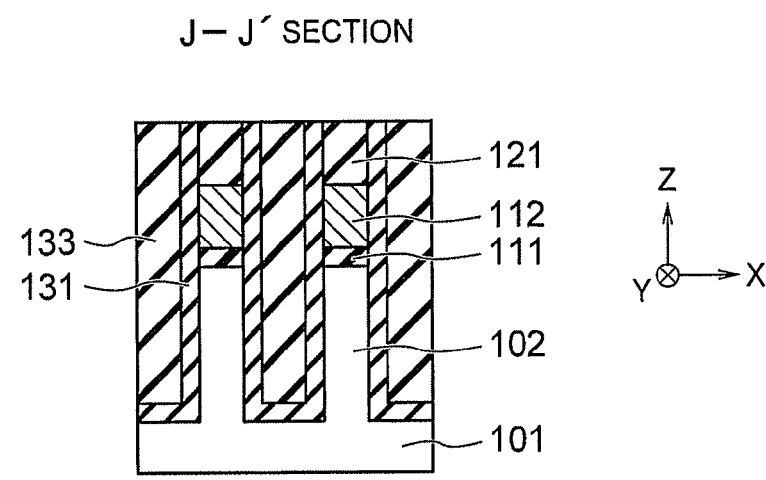
FIG. 15B  J-J' SECTION

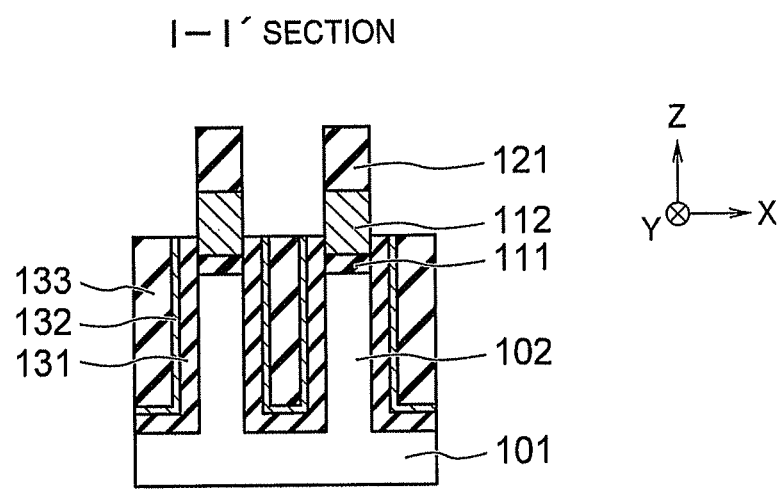
FIG.16A  I–I' SECTION
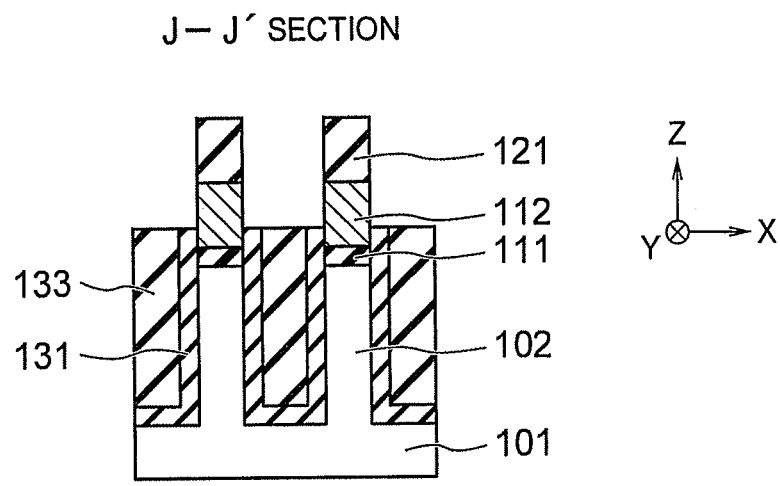
FIG.16B  J–J' SECTION

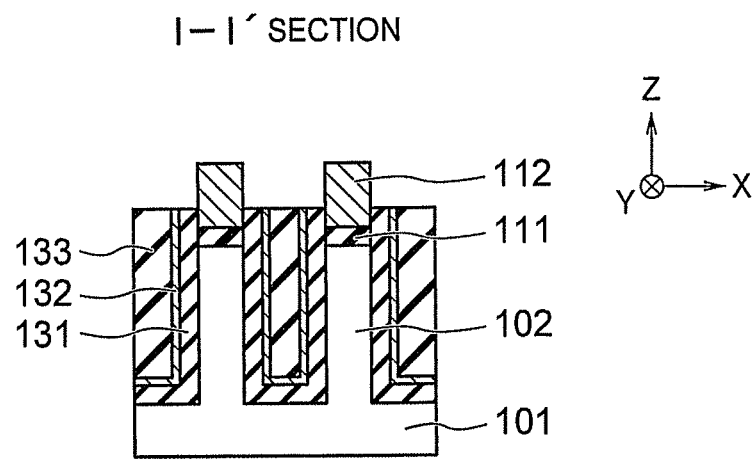
FIG.17A  I—I' SECTION
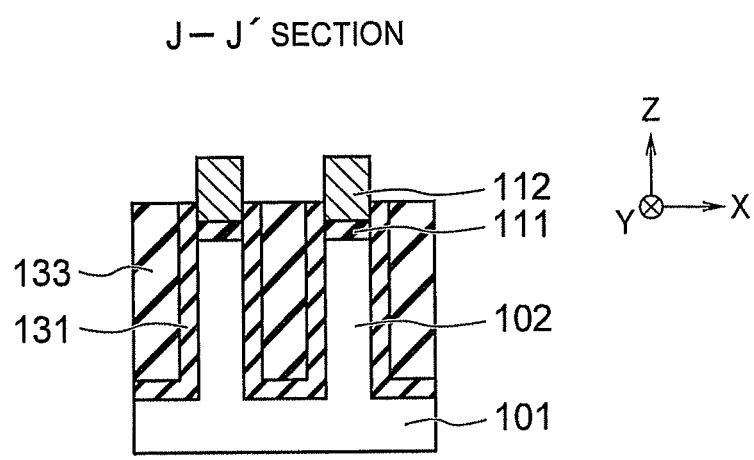
FIG.17B  J—J' SECTION

I-I' SECTION

J-J' SECTION

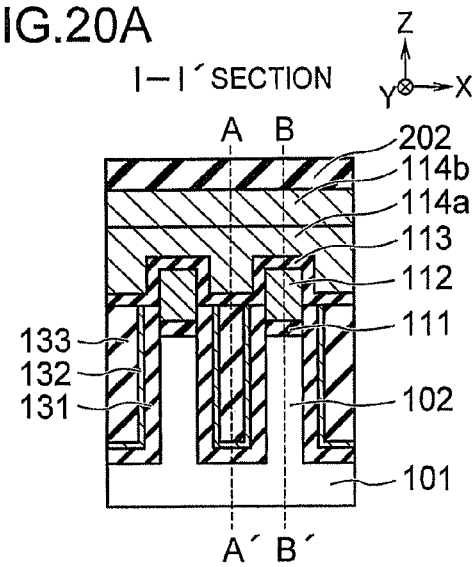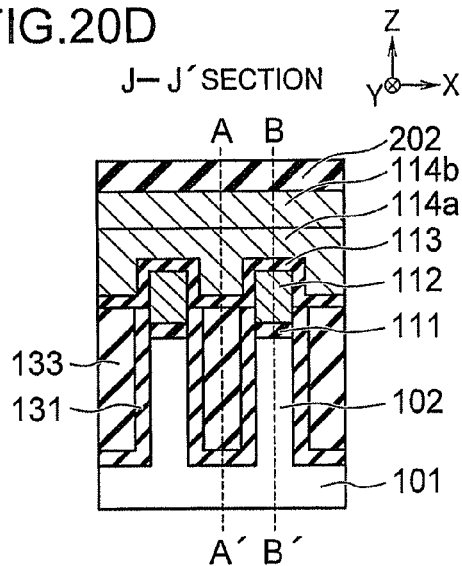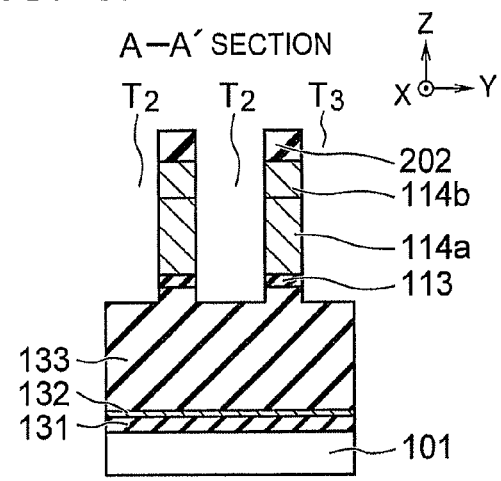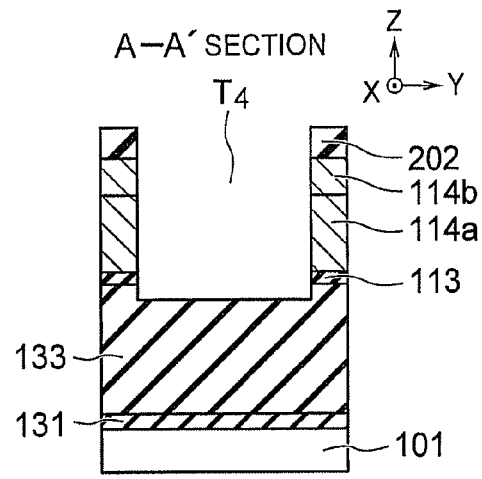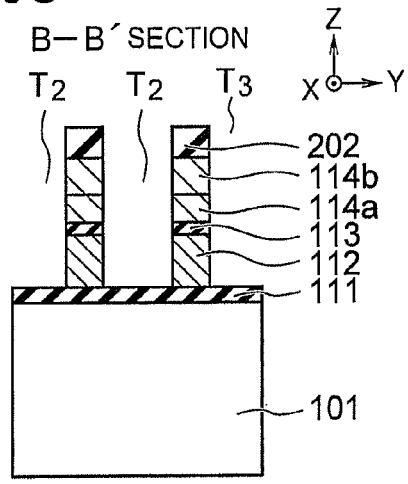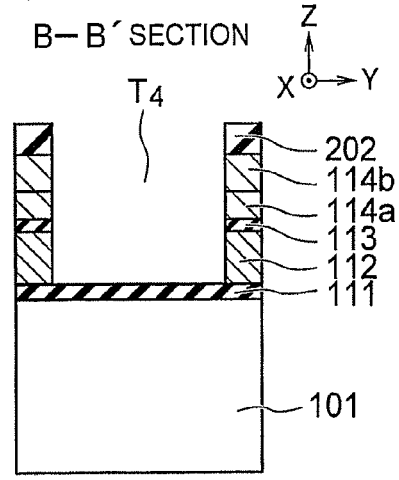

METHOD OF MANUFACTURING SEMICONDUCTOR DEVICE

CROSS REFERENCE TO RELATED APPLICATION

This application is based upon and claims the benefit of priority from the prior Japanese Patent Application No. 2011-230795, filed on Oct. 20, 2011, the entire contents of which are incorporated herein by reference.

FIELD

Embodiments described herein relate to a method of manufacturing a semiconductor device.

BACKGROUND

In recent years, a shallow trench isolation (STI) structure including an air gap has been proposed in order to suppress intensification of a Yupin/Enda effect due to miniaturization of integrated circuit patterns. Such an STI structure is formed, for example, by burying a sacrificial layer in an isolation trench, forming a layer to serve as the upper surface of the air gap on the sacrificial layer, and then removing the sacrificial layer by etching. However, this method has a problem that it is difficult to form a large air gap in a case where the tolerance of the sacrificial layer to the etching is high.

BRIEF DESCRIPTION OF THE DRAWINGS

FIGS. 7A to 8C are cross-sectional views illustrating a method of manufacturing a semiconductor device according to a modification of the first embodiment;

FIGS. 10A to 24F are cross-sectional views and plan views illustrating a method of manufacturing the semiconductor device of the second embodiment;

DETAILED DESCRIPTION

Embodiments will now be explained with reference to the accompanying drawings.

An embodiment described herein is a method of manufacturing a semiconductor device, the method including forming an isolation trench in a substrate, and forming an amorphous layer on a sidewall surface of the isolation trench. The method further includes forming a sacrificial layer in the isolation trench via the amorphous layer, and forming an air gap layer on the sacrificial layer. The method further includes forming an air gap in the isolation trench under the air gap layer by removing the sacrificial layer after forming the air gap layer.

First Embodiment

FIGS. 1A to 6C are cross-sectional views illustrating a method of manufacturing a semiconductor device of a first embodiment. The semiconductor device of the present embodiment is a NAND flash memory.

Figure 1A:
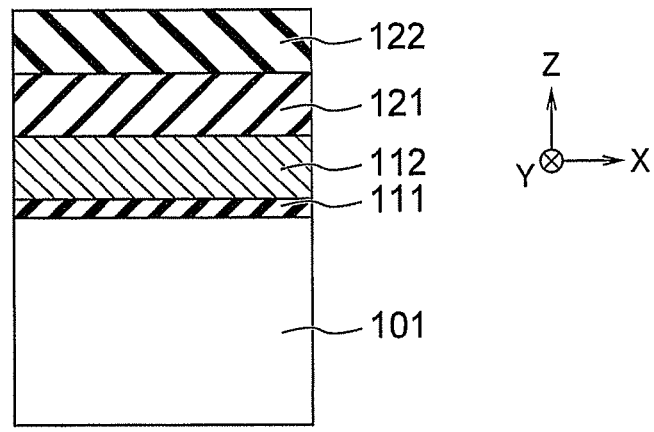
FIGS. 1A to 6C are cross-sectional views illustrating a method of manufacturing a semiconductor device of a first embodiment.

First, as illustrated in FIG. 1A, a first insulating layer 111 for forming a gate insulator of a cell transistor, a first electrode layer 112 for forming a charge storage layer (for example, a floating gate) of the cell transistor, a chemical mechanical polishing (CMP) stopper 121, and a hard mask layer 122 are successively formed on a semiconductor substrate 101.

The semiconductor substrate 101 is, for example, a silicon substrate. The semiconductor substrate 101 is an example of a substrate of the disclosure. FIG. 1A shows X and Y directions parallel to the principal surface of the semiconductor substrate 101 and orthogonal to each other, and a Z direction perpendicular to the principal surface of the semiconductor substrate 101. As will be described later, the X direction corresponds to a word-line direction, and the Y direction corresponds to a bit-line direction. The X and Y directions are examples of second and first directions of the disclosure, respectively.

The first insulating layer 111 is, for example, a silicon oxide layer formed by thermal oxidation. In the present embodiment, the thickness of the first insulating layer 111 is 8 nm or less. In addition, the first electrode layer 112 is, for example, a polysilicon layer. In the present embodiment, the thickness of the first electrode layer 112 is 100 to 200 nm, for example, 100 nm. The first electrode layer 112 may be a silicide layer, such as a WSi (tungsten silicide) layer and a CoSi (cobalt silicide) layer.

The CMP stopper 121 is, for example, a silicon nitride layer formed by reduced-pressure chemical vapor deposition (CVD). In the present embodiment, the thickness of the CMP stopper 121 is approximately 200 nm. The CMP stopper 121 may be a polysilicon layer having a thickness of approximately 100 to 200 nm. In addition, the hard mask layer 122 is, for example, a TEOS layer formed by reduced-pressure CVD. In the present embodiment, the thickness of the hard mask layer 122 is approximately 300 nm.

Figure 1B:
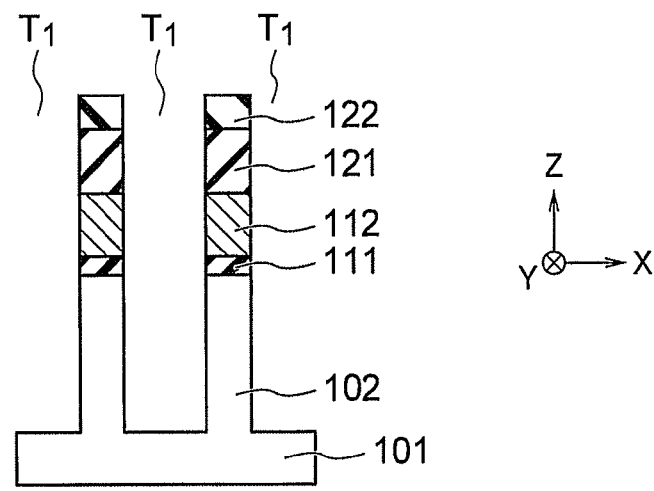

Next, as illustrated in FIG. 1B, a plurality of isolation trenches (STI trenches) $T_1$ are formed by dry etching using the hard mask layer 122 as a mask, so as to penetrate the CMP stopper 121, the first electrode layer 112 and the first insulating layer 111 and reach the semiconductor substrate 101. At this time, the hard mask layer 122 is made thinner by dry etching, but remains in part on the CMP stopper 121. The hard mask layer 122 is patterned by photolithography and etching.

Each isolation trench $T_1$ is formed into a shape extending in the Y direction, as illustrated in FIG. 1B. In the present embodiment, the X-direction width of each isolation trench $T_1$ is 30 nm or less. In addition, the Z-direction depth of each isolation trench $T_1$ is approximately 200 to 500 nm.

Each isolation trench $T_1$ is formed so that a surface of the semiconductor substrate 101 is etched, as illustrated in FIG. 1B. As a result, device regions 102 referred to as an active area (AA) are formed in the surface of the semiconductor substrate 101. According to the step shown in FIG. 1B, a structure in which the first insulating layer 111, the first electrode layer 112, the CMP stopper 121, and the hard mask layer 122 are successively stacked is formed on the device regions 102 of the semiconductor substrate 101.

Figure 1C:
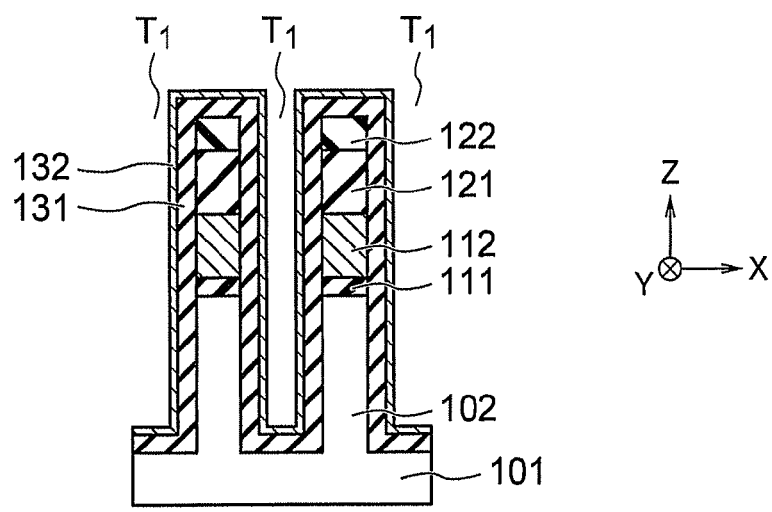

Next, as illustrated in FIG. 1C, a protective layer 131 for protecting the sidewall surfaces of each isolation trench $T_1$ is formed on the entire surface of the semiconductor substrate 101. As a result, the protective layer 131 is formed on the sidewall surfaces and bottom surface of the isolation trench $T_1$. The protective layer 131 is, for example, an oxide layer such as a TEOS layer and an HTO layer formed by CVD. In the present embodiment, the protective layer 131 is formed so that the thickness thereof on the sidewall surfaces of the isolation trench $T_1$ is approximately 1 to 20 nm.

Next, as illustrated in FIG. 1C, an amorphous layer 132 is formed on the entire surface of the semiconductor substrate 101. As a result, the amorphous layer 132 is formed on the sidewall surfaces and bottom surface of each isolation trench $T_1$ via the protective layer 131. The amorphous layer 132 is, for example, an a-Si (amorphous silicon) layer formed by CVD. In the present embodiment, the thickness of the amorphous layer 132 is 5 nm or less, for example, 2 nm or less. The amorphous layer 132 may be a silicon-containing layer other than an a-Si layer.

In the present embodiment, it is sufficient if the amorphous layer 132 attaches the sidewall surfaces of each isolation trench $T_1$ only in extremely small amounts. In other words, the amorphous layer 132 need not completely cover the protective layer 131 on the sidewall surfaces. In addition, in the present embodiment, the amorphous layer 132 attached to the upper surface of the hard mask layer 122 is not necessary, and therefore, may be removed by anisotropic etching. However, the amorphous layer 132 on the upper surface of the hard mask layer 122 can be removed naturally by later-described CMP, if the amorphous layer is a thin film. Accordingly, the amorphous layer 132 need not be removed by anisotropic etching.

Figure 2A:
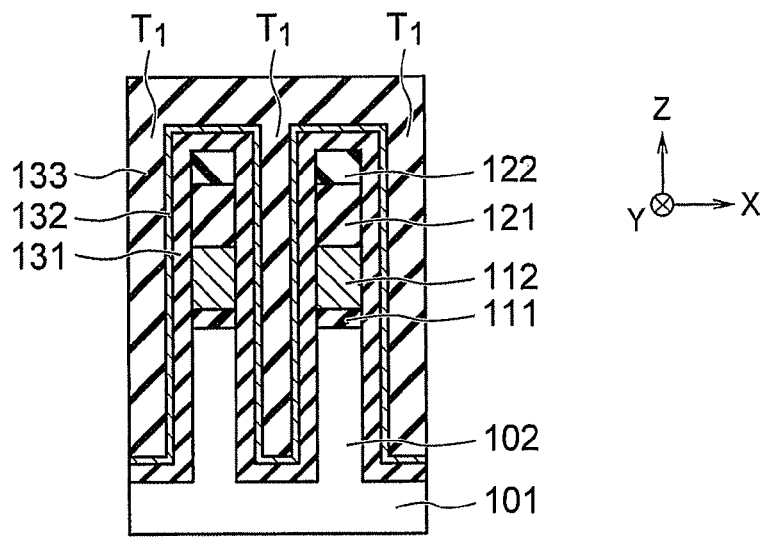

Next, as illustrated in FIG. 2A, a sacrificial layer 133 for forming air gaps is formed on the entire surface of the semiconductor substrate 101. As a result, the sacrificial layer 133 is buried in each isolation trench $T_1$ via the protective layer 131 and the amorphous layer 132. The sacrificial layer 133 is formed, for example, by forming a sacrificial layer material such as a perhydropolysilazane (PHPS) layer or a hydrogen silsesquioxane (HSQ) layer on the entire surface of the semiconductor substrate 101, and then oxidizing the sacrificial layer material by heat treatment to change the material into an oxide layer. The PHPS layer and the HSQ layer have the advantage of being able to be easily buried in, for example, even a narrow isolation trench $T_1$.

A coating method is simple and convenient as a method of forming the sacrificial layer material. CVD may be used instead, however. In addition, the heat treatment of the sacrificial layer material is performed in oxygen or water vapor, for example, within a range of 230 to 900° C., desirably at 300° C. or higher. The reason for this is that an etching rate is faster at the time of etching the sacrificial layer 133, and therefore, air gaps are easily formed, if the sacrificial layer 133 is oxidized at a temperature elevated to some extent. The sacrificial layer material may be hardened by performing the heat treatment thereof in a nitrogen atmosphere.

Figure 2B:
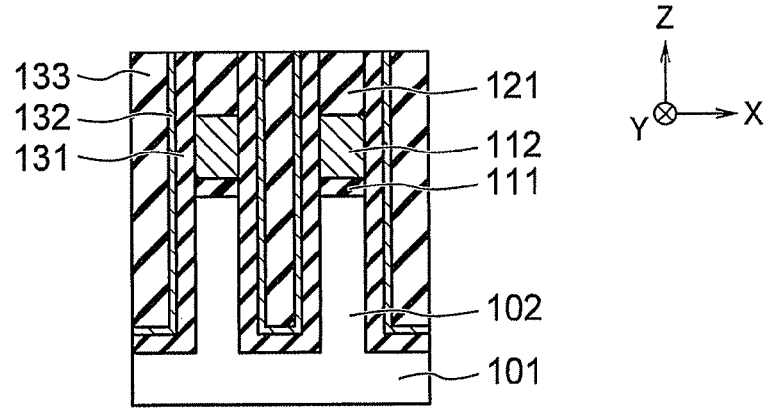

Next, as illustrated in FIG. 2B, the CMP processing of the sacrificial layer 133 is performed using the CMP stopper 121 as a stopper to planarize the upper surface of the sacrificial layer 133. As a result, as illustrated in FIG. 2B, the upper surface of the CMP stopper 121 becomes exposed.

Figure 2C:
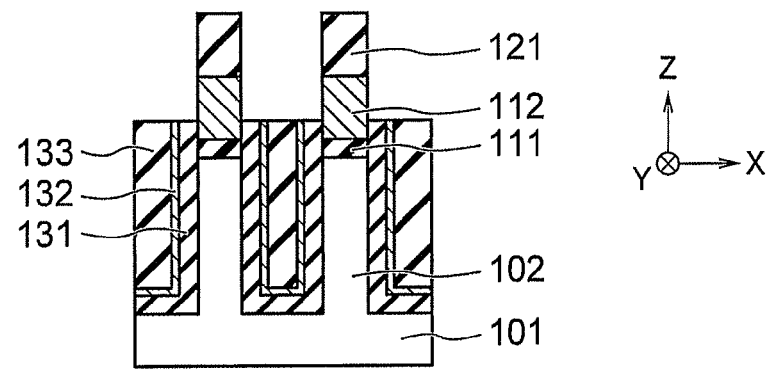

Next, as illustrated in FIG. 2C, the sacrificial layer 133 is etched to lower the upper surface of the sacrificial layer 133. At this time, the protective layer 131 and the amorphous layer 132 are desirably etched simultaneously with the etching of the sacrificial layer 133. The protective layer 131 and the amorphous layer 132 may be etched separately after the etching of the sacrificial layer 133.

In the etching treatment shown in FIG. 2C, the post-etching height of the upper end of the protective layer 131 can be made greater than the post-etching height of the upper surface of the sacrificial layer 133. In addition, in the etching treatment illustrated in FIG. 2C, the post-etching height of the upper surface of the sacrificial layer 133 is desirably close to the height of the upper surface of the first insulating layer 111. More desirably, the post-etching height is greater than the height of the upper surface of the first insulating layer 111. The upper surface of the sacrificial layer 133 may have a height other than the above-mentioned height, however. The etching treatment illustrated in FIG. 2C may be performed by means of either dry etching or wet etching.

Figure 3A:
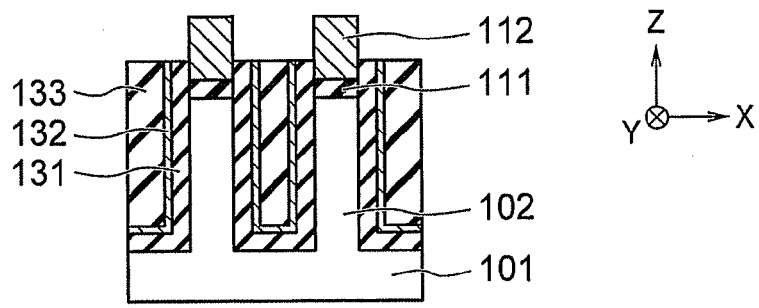

Next, as illustrated in FIG. 3A, the CMP stopper 121 is removed using a phosphoric acid solution. As a result, as illustrated in FIG. 3A, the upper surface of the first electrode layer 112 becomes exposed. The CMP stopper 121 may be removed before the etching treatment illustrated in FIG. 2C.

Figure 3B:
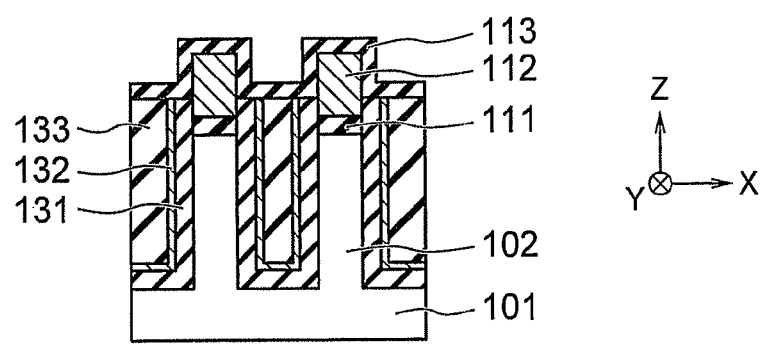

Next, as illustrated in FIG. 3B, a second insulating layer 113 for forming an inter electrode insulator (for example, an intergate insulator) of a cell transistor is formed on the entire surface of the semiconductor substrate 101. As a result, the second insulating layer 113 is continuously formed on the upper surface and side surfaces of the first electrode layer 112 and on the upper surface of the sacrificial layer 133 in each isolation trench $T_1$. The second insulating layer 113 is, for example, an ONO stacked layer including a first silicon oxide layer, a silicon nitride layer, and a second silicon oxide layer successively formed therein by CVD. In the present embodiment, the thickness of the second insulating layer 113 is approximately 20 nm.

In the present embodiment, an air gap is formed in each isolation trench $T_1$ under the second insulating layer 113 by removing the sacrificial layer 133 after the formation of the second insulating layer 113, as will be described later. The second insulating layer 113 is an example of an air gap layer of the disclosure.

Figure 3C:
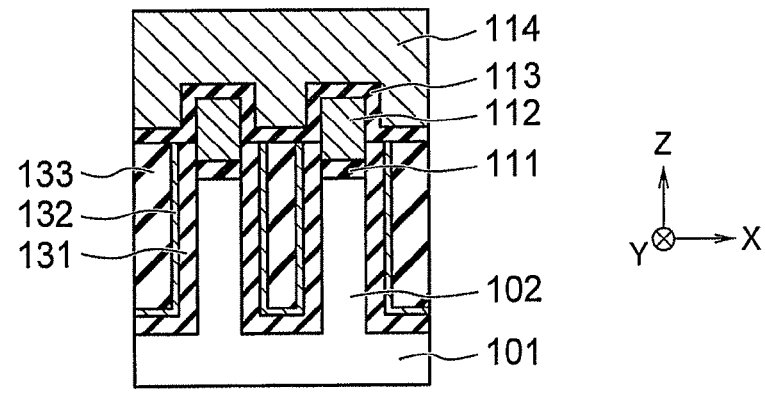

Next, as illustrated in FIG. 3C, a second electrode layer 114 for forming a control gate of the cell transistor is formed on the entire surface of the semiconductor substrate 101. As a result, the second electrode layer 114 is formed on the second insulating layer 113. The second electrode layer 114 is, for example, a stacked layer including a polysilicon layer and a tungsten layer successively formed therein by CVD. In the present embodiment, the thickness of the second electrode layer 114 is approximately 50 nm.

Figure 4A:
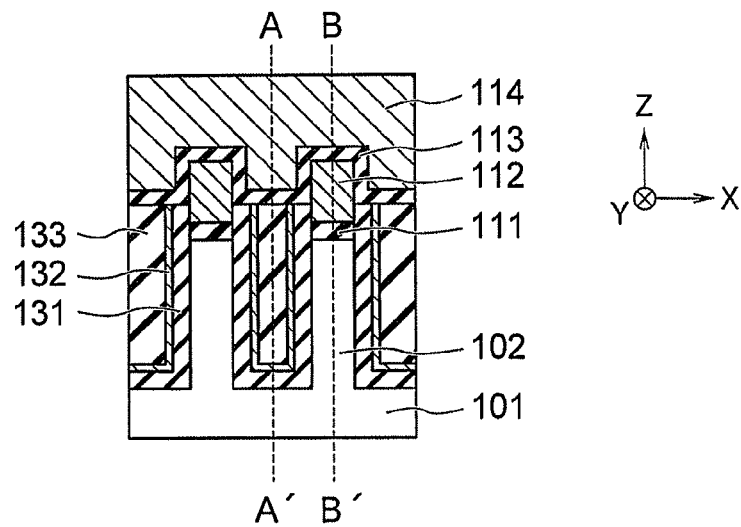
Figure 4B:
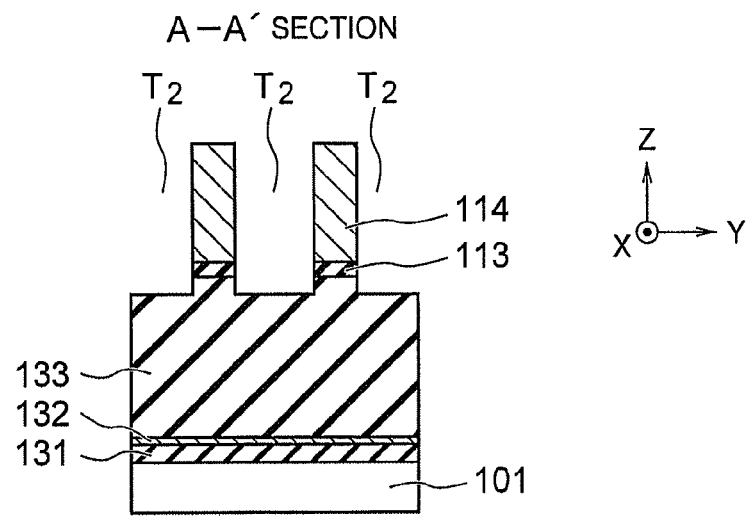
Figure 4C:
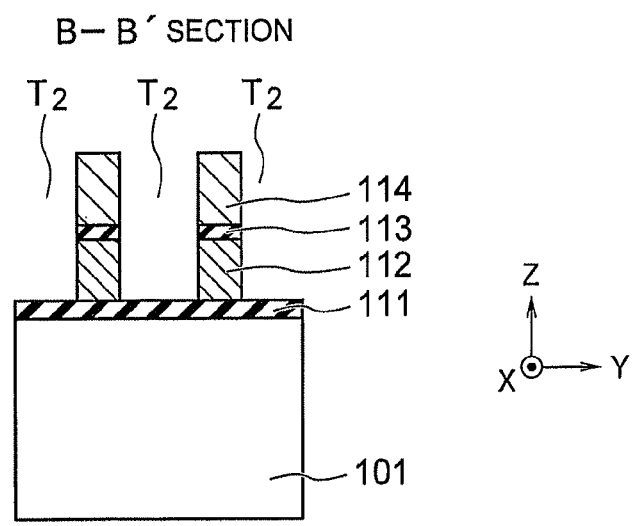

Next, as illustrated in FIGS. 4A to 4C, a plurality of trenches $T_2$ extending in the X direction are formed by photolithography and dry etching, so as to penetrate the second electrode layer 114, the second insulating layer 113 and the first electrode layer 112 and reach the first insulating layer 111. As a result, a plurality of cell transistors each including a gate insulator 111, a charge storage layer 112, an inter electrode insulator 113, and a control gate 114 are formed on the semiconductor substrate 101. FIGS. 4B and 4C are cross-sectional views taken along lines A-A' and B-B', respectively, shown in FIG. 4A.

As illustrated in FIGS. 4A to 4C, the inter electrode insulator 113 and the control gate 114 are processed into a shape extending in the X direction. The control gate 114 functions as a word line of each cell transistor. FIG. 4B illustrates a cross section of the sacrificial layer 133 in each isolation trench $T_1$. As illustrated in FIG. 4B, each trench $T_2$ is formed so as to reach the sacrificial layer 133.

FIGS. 5A to 6C to be described later are cross-sectional views corresponding respectively to FIGS. 4A to 4C.

Figure 5A:
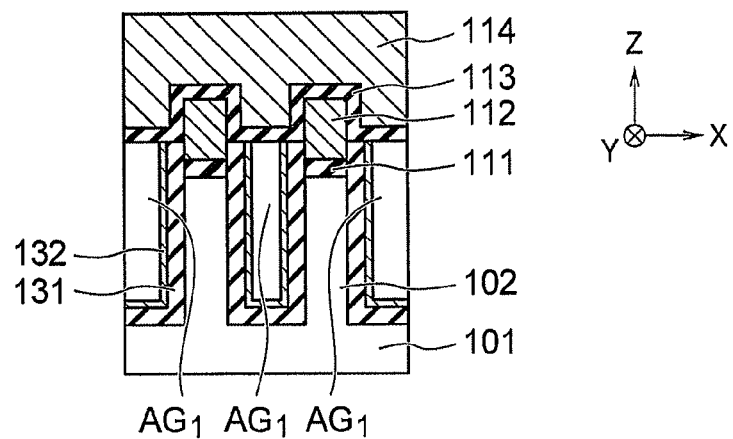
Figure 5B:
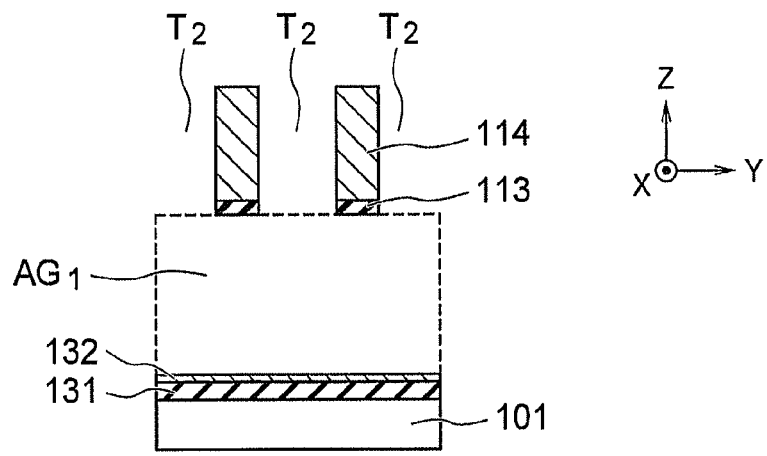
Figure 5C:
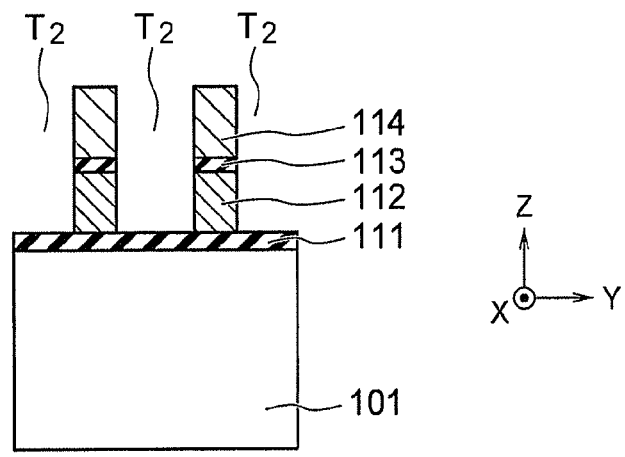

Next, as illustrated in FIGS. 5A to 5C, the sacrificial layer 133 in each isolation trench $T_1$ is removed by isotropic etching. As a result, an air gap $AG_1$ extending in the Y direction is formed in each isolation trench $T_1$. The isotropic etching of the sacrificial layer 133 is performed using, for example, a hydrofluoric acid solution.

As the result of the experiments made by the present inventors, it has become clear that the etching rate of the sacrificial layer 133 varies depending on the amount of amorphous layer 132 attached to the sidewall surfaces of each isolation trench $T_1$ and the oxidizing temperature of the sacrificial layer 133. Specifically, it has become clear that if the thickness of the amorphous layer 132 is set to 5 nm or less in a case where the amorphous layer 132 is, for example, an a-Si layer, the etching rate of the sacrificial layer 133 becomes faster, compared with a case where the amorphous layer 132 is not present or the thickness thereof is greater than 5 nm.

Accordingly, in the present embodiment, the sacrificial layer 133 is buried in each isolation trench $T_1$ via a thin amorphous layer 132. Consequently, in the present embodiment, it is possible to increase the etching rate of the sacrificial layer 133 and form a large air gap $AG_1$ in a short period of etching.

If the etching time of the sacrificial layer 133 becomes longer, a material of, for example, the second insulating layer 113 may dissolve. According to the present embodiment, the dissolution of such a material can be prevented by shortening the etching time of the sacrificial layer 133.

Figure 6A:
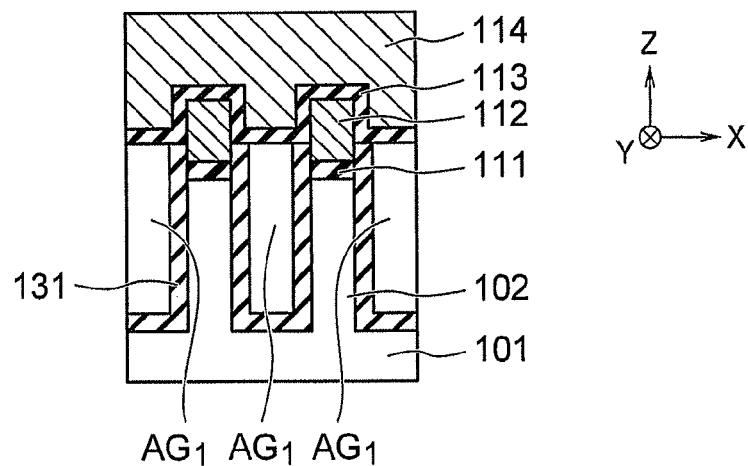
Figure 6B:
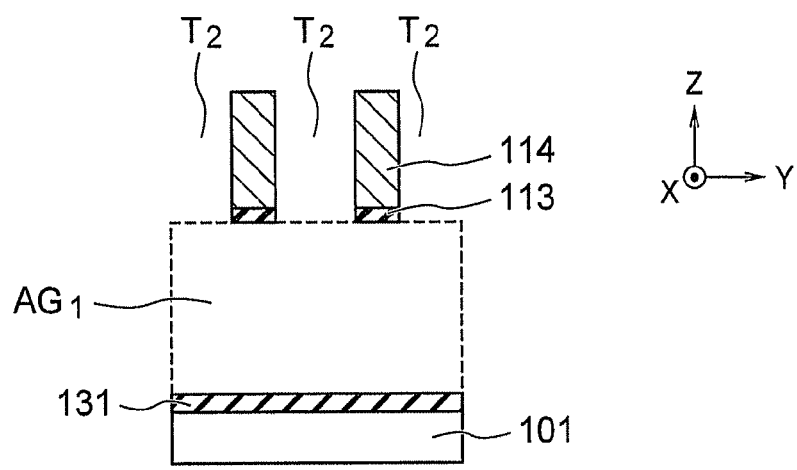
Figure 6C:
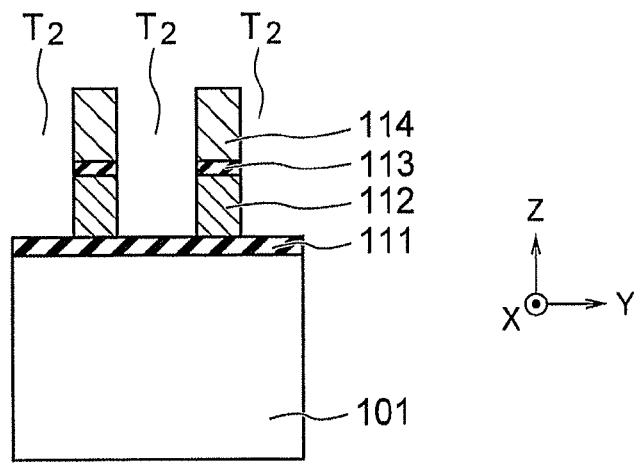

Next, as illustrated in FIGS. 6A to 6C, the amorphous layer 132 in each isolation trench $T_1$ is removed using an alkaline solution. As a result, the amorphous layer 132 in each air gap $AG_1$ is removed. The amorphous layer 132 is desirably removed using a chemical solution less likely to etch the first electrode layer 112 and the second electrode layer 114.

In the present embodiment, an inter layer dielectric, a contact plug, a via plug, an interconnect layer and the like are then formed on the semiconductor substrate 101. In this way, the semiconductor device of the present embodiment is manufactured.

(1) Modification of First Embodiment

Next, a modification of the first embodiment will be described with reference to FIGS. 7A to 8C. FIGS. 7A to 8C are cross-sectional views illustrating a method of manufacturing a semiconductor device according to the modification of the first embodiment.

Figure 7A:
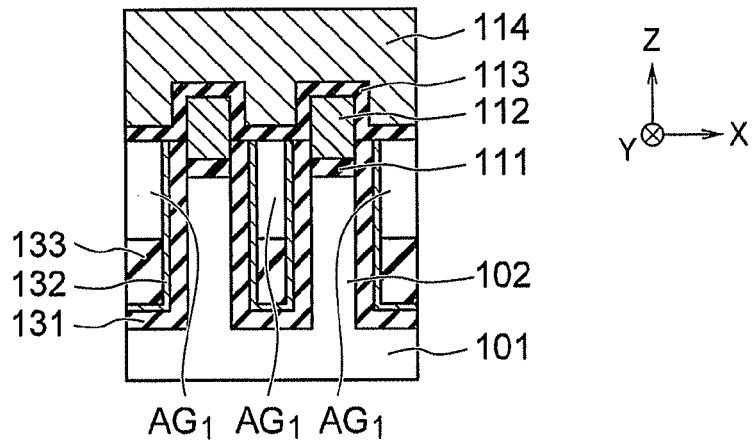
Figure 7B:
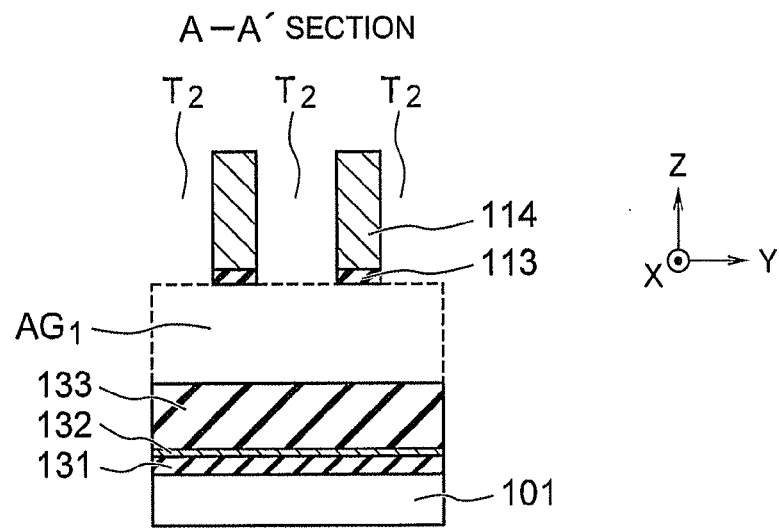
Figure 7C:
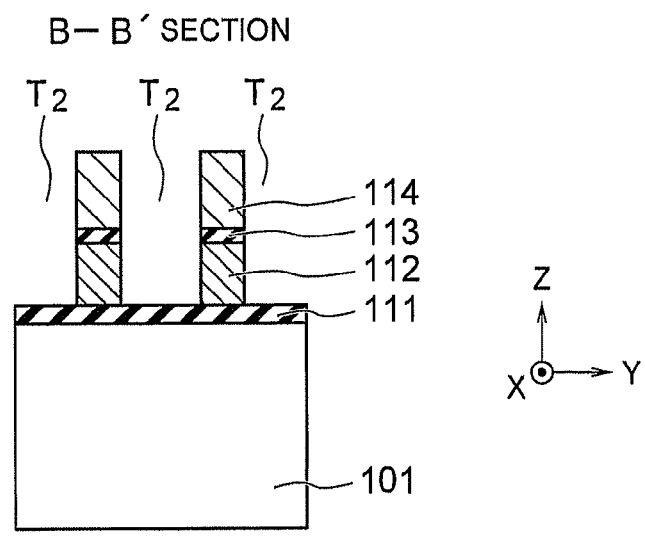

In the isotropic etching of the sacrificial layer 133 illustrated in FIGS. 5A to FIG. 5C, the sacrificial layer 133 is entirely removed. In the present embodiment, however, part of the sacrificial layer 133 may be left over, as long as the sacrificial layer 133 is dug down to such a depth as to be able to suppress the Yupin/Enda effect of which a current flows between adjacent charge storage layers 112 through an isolation region (FIGS. 7A to 7C). In FIGS. 7A to 7C, the isotropic etching of the sacrificial layer 133 is performed so as to leave over part of the sacrificial layer 133.

In addition, in the removal of the amorphous layer 132 illustrated in FIGS. 6A to 6C, the amorphous layer 132 is entirely removed. In the case of the present modification, however, only part of the amorphous layer 132 is also removed, as illustrated in FIGS. 8A to 8C. Specifically, only the amorphous layer 132 in a portion which has become exposed after the removal of the sacrificial layer 133 is removed.

Steps illustrated in FIGS. 7A to 8C have, for example, the advantage of being able to perform the isotropic etching of the sacrificial layer 133 in a short period of time, compared with the steps illustrated in FIGS. 5A to 6C. On the other hand, the steps illustrated in FIGS. 5A to 6C have, for example, the advantage of being able to form a large air gap $AG_1$, compared with the steps illustrated in FIGS. 7A to 8C.

(2) Effects of First Embodiment

Finally, effects of the first embodiment will be described.

As described above, in the present embodiment, the amorphous layer 132 is formed on the sidewall surfaces of each isolation trench $T_1$, and then the sacrificial layer 133 is formed in the isolation trench $T_1$ via the amorphous layer 132. Consequently, according to the present embodiment, it is possible to increase the etching rate of the sacrificial layer 133 and form a large air gap $AG_1$ for isolation in a short period of etching.

The present embodiment may be applied to the isolation structure of a semiconductor device other than a NAND flash memory.

Second Embodiment

Figure 9:
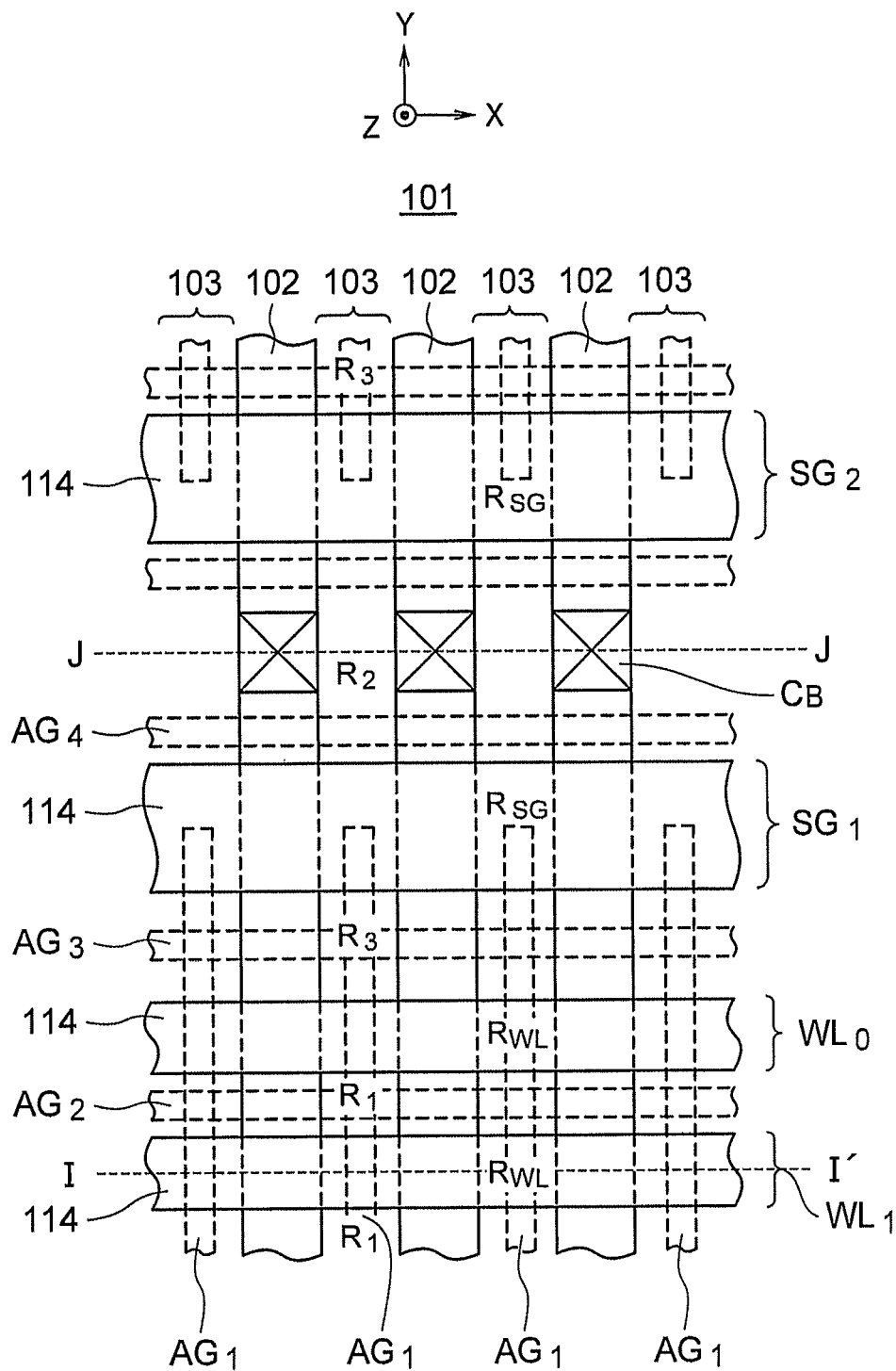
FIG. 9 is a plan view illustrating a structure of a semiconductor device of a second embodiment.

FIG. 9 is a plan view illustrating a structure of a semiconductor device of a second embodiment. The semiconductor device of FIG. 9 is a NAND flash memory. FIG. 9 illustrates a memory cell array of the NAND flash memory.

The semiconductor device of FIG. 9 includes a semiconductor substrate 101, device regions 102 formed in the semiconductor substrate 101, and isolation regions 103 formed in the semiconductor substrate 101 so as to isolate the device regions 102 from one another. The device regions 102 and the isolation regions 103 extend in the Y direction (bit-line direction), and are disposed alternately along the X direction (word-line direction).

The semiconductor device of FIG. 9 further includes a plurality of word lines WL and a plurality of selection gates SG formed on the semiconductor substrate 101. The word lines WL and the selection gates SG extend in the X direction and are adjacent to each other in the Y direction. In addition, the word lines WL and the selection gates SG are formed of the above-described second electrode layer 114. Each word line WL functions as an interconnect for cell transistors, and each selection gate SG functions as an interconnect for selection transistors. The word lines WL and the selection gates SG are examples of first and second interconnects, respectively.

FIG. 9 illustrates $WL_0$ and $WL_1$ as examples of the word lines WL, and $SG_1$ and $SG_2$ as examples of the selection gates SG. The $SG_1$, $WL_0$ and $WL_1$ form the same NAND string, and the $SG_2$ forms an adjacent NAND string. Reference character $C_B$ denotes bit line contacts located between the selection gates $SG_1$ and $SG_2$ on the device regions 102.

The semiconductor device of FIG. 9 further includes air gaps $AG_1$ formed in the isolation regions 103, an air gap $AG_2$ formed between word lines WL, an air gap $AG_3$ formed between a word line WL and a selection gate SG, and an air gap $AG_4$ formed between selection gates SG. The air gaps $AG_1$ are shaped to extend in the Y direction, and the air gaps $AG_2$, $AG_3$, and $AG_4$ are shaped to extend in the X direction. The air gaps $AG_3$ and $AG_4$ need not necessarily be formed, depending on a process flow.

Here, the shape of the air gaps $AG_1$ will be described.

Reference character $R_1$ shown in FIG. 9 denotes a region located between word lines WL in the semiconductor substrate 101. Reference character $R_2$ denotes a region located between selection gates SG in the semiconductor substrate 101. Reference character $R_3$ denotes a region located between a word line WL and a selection gate SG in the semiconductor substrate 101. The regions $R_1$ to $R_3$ are examples of first to third regions, respectively.

Reference character $R_{WL}$ denotes a region located under each word line WL in the semiconductor substrate 101, and reference character $R_{SG}$ denotes a region located under each selection gate SG in the semiconductor substrate 101. The regions $R_{WL}$ and $R_{SG}$ are examples of first-interconnect and second-interconnect lower regions, respectively.

In the present embodiment, the air gaps $AG_1$ are continuously formed in the regions $R_1$, $R_{WL}$ and $R_3$ but terminated in the regions $R_{SG}$, and therefore are not formed in the region $R_2$. As a result, the air gaps $AG_1$ are formed only in the first and third regions $R_1$ and $R_3$ among the first to third regions $R_1$ to $R_3$. The advantage of such a shape of the air gaps $AG_1$ will be described later. The air gaps $AG_1$ may be formed only in the first regions $R_1$ among the regions $R_1$ to $R_3$, as will be described later.

(1) Method of Manufacturing Semiconductor Device of Second Embodiment

Next, a method of manufacturing a semiconductor device of a second embodiment will be described with reference to FIGS. 10A to 24F.

FIGS. 10A to 24F are cross-sectional views and plan views illustrating the method of manufacturing the semiconductor device of the second embodiment. The method of the second embodiment will be described with a focus on the differences from the method of the first embodiment.

Figure 10A:
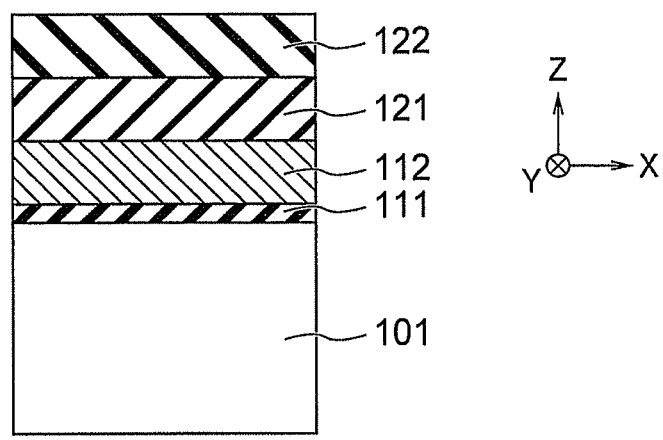

First, as illustrated in FIG. 10A, a first insulating layer 111 for forming gate insulators of a cell transistor and a selection transistor, a first electrode layer 112 for forming the charge storage layer of the cell transistor and the gate electrode of the selection transistor, a CMP stopper 121, and a hard mask layer 122 are successively formed on the semiconductor substrate 101.

Figure 10B:
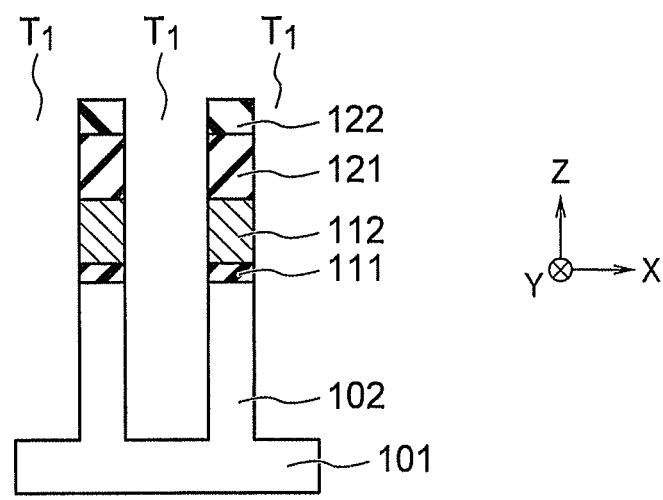

Next, as illustrated in FIG. 10B, a plurality of isolation trenches $T_1$ are formed by dry etching using the hard mask layer 122 as a mask, so as to penetrate the CMP stopper 121, the first electrode layer 112 and the first insulating layer 111 and reach the semiconductor substrate 101.

Figure 11A:
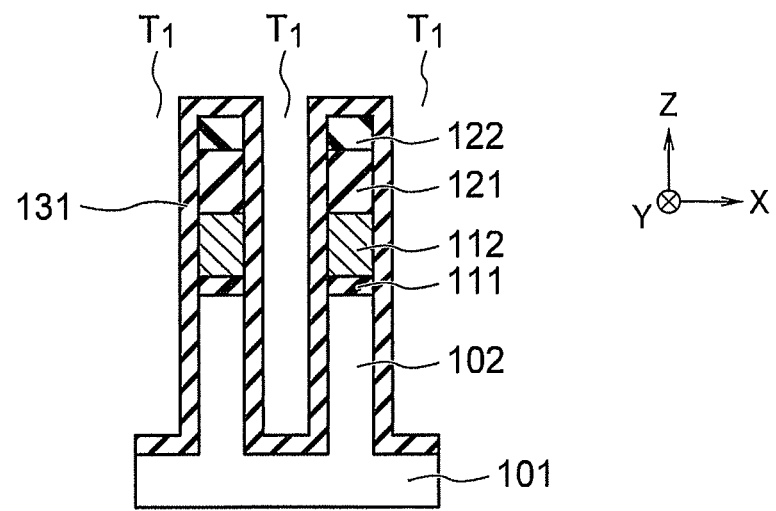

Next, as illustrated in FIG. 11A, a protective layer 131 for protecting the sidewall surfaces of each isolation trench $T_1$ is formed on the entire surface of the semiconductor substrate 101. As a result, the protective layer 131 is formed on the sidewall surfaces and bottom surface of each isolation trench $T_1$.

Figure 11B:
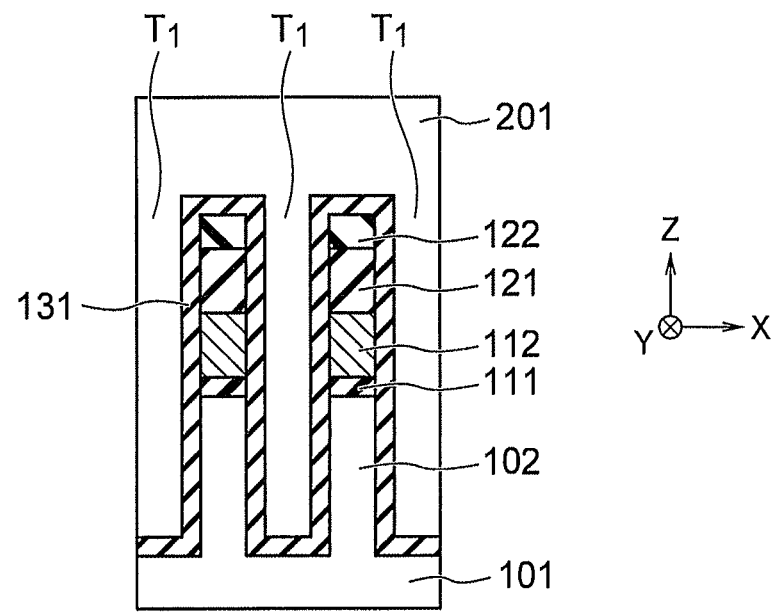

Next, as illustrated in FIG. 11B, a resist layer 201 is coated on the entire surface of the semiconductor substrate 101. Next, the resist layer 201 is patterned by exposure and development. As a result, predetermined regions on the semiconductor substrate 101 are covered with the resist layer 201.

Figure 12:
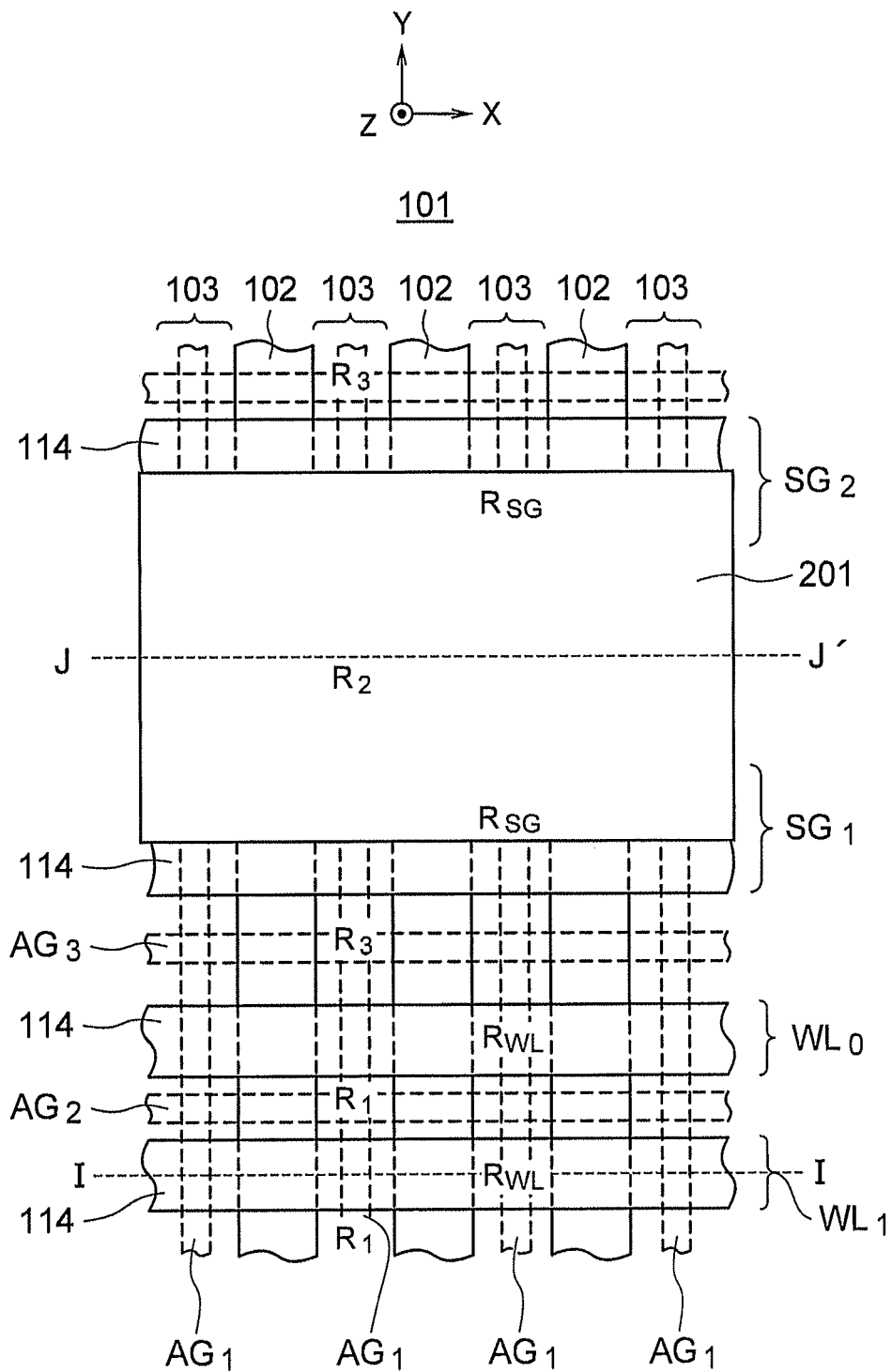

Here, the regions to be covered with the resist layer 201 will be described with reference to FIG. 12. FIG. 12 is a plan view illustrating the method of manufacturing the semiconductor device of the second embodiment. In FIG. 12, the word lines WL, the selection gates SG, the air gaps $AG_1$ to $AG_4$, and the like to be formed in later-described steps are illustrated as a matter of convenience, in order to describe the positions of the regions to be covered with the resist layer 201.

In the present embodiment, the resist layer 201 is patterned so as to cover the entire area of the second region $R_2$ and part of the second-interconnect lower regions $R_{SG}$ among the regions $R_1$, $R_2$, $R_3$, $R_{WL}$ and $R_{SG}$, as illustrated in FIG. 12.

In the present embodiment, part of the second-interconnect lower regions $R_{SG}$ is covered with the resist layer 201. Alternatively, the entire area of the second-interconnect lower regions $R_{SG}$ may be covered with the resist layer 201, or the second-interconnect lower regions $R_{SG}$ need not be covered with the resist layer 201.

Figure 13A:
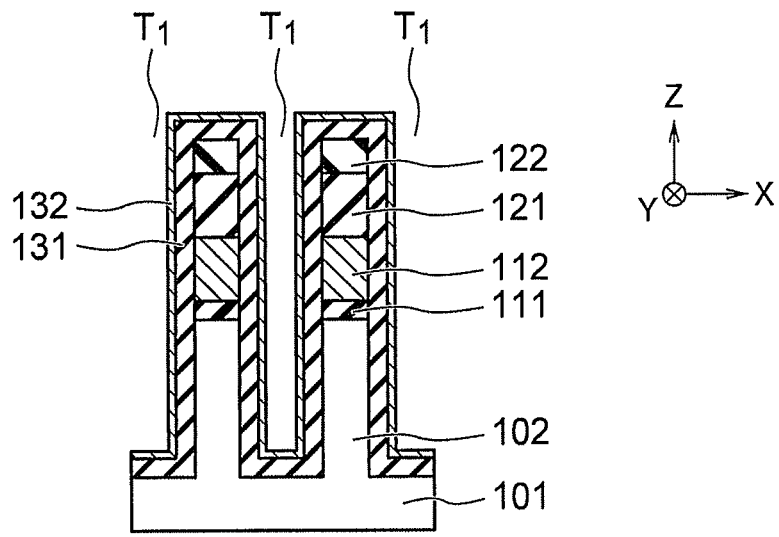
Figure 13B:
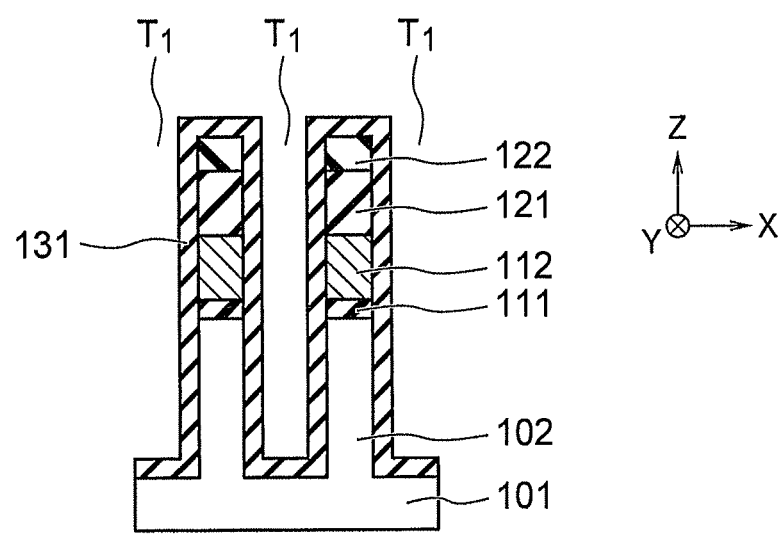

Next, as illustrated in FIGS. 13A and 13B, an amorphous layer 132 is formed on the entire surface of the semiconductor substrate 101, and then the resist layer 201 is removed using a separating liquid.

FIG. 13A is a cross-sectional view taken along a line I-I' shown in FIG. 12. FIG. 13A illustrates regions not covered with the resist layer 201 at the time of forming the amorphous layer 132. On the other hand, FIG. 13B is a cross-sectional view taken along a line J-J' shown in FIG. 12. FIG. 13B illustrates regions covered with the resist layer 201 at the time of forming the amorphous layer 132.

In the regions not covered with the resist layer 201, the amorphous layer 132 is formed on the sidewall surfaces and bottom surface of each isolation trench $T_1$ via the protective layer 131, as illustrated in FIG. 13A. This is the same as in the case of FIG. 1C. On the other hand, the amorphous layer 132 is not formed in the regions covered with the resist layer 201, as illustrated in FIG. 13B. As a result, the first and third regions $R_1$ and $R_3$ become regions in which the amorphous layer 132 is present, and the second region $R_2$ becomes a region in which the amorphous layer 132 is not present.

Figure 14A:
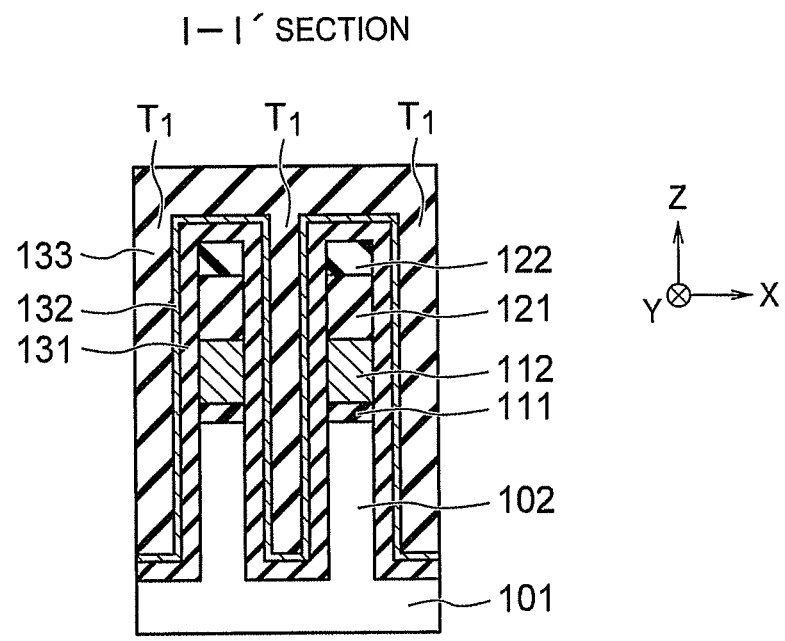
Figure 14B:
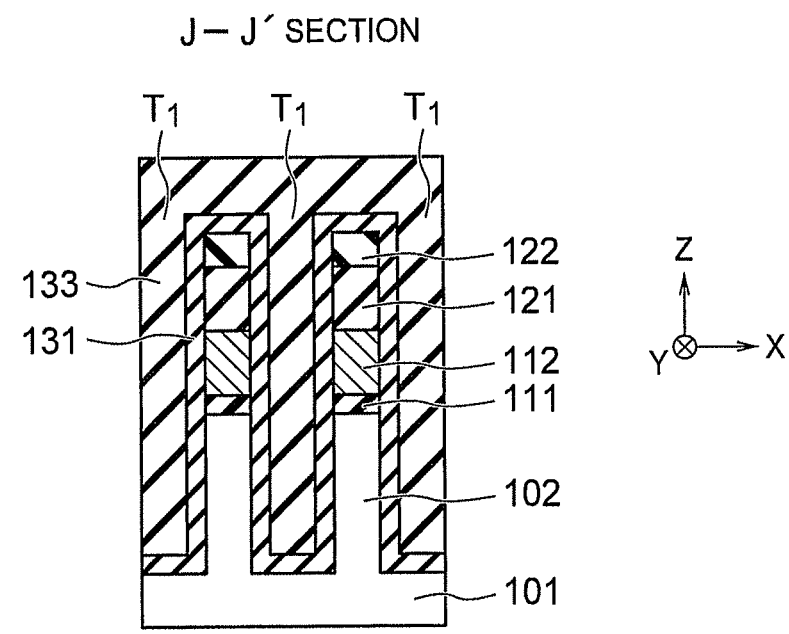

Next, as illustrated in FIGS. 14A and 14B, the sacrificial layer 133 for forming the air gaps $AG_1$ is formed on the entire surface of the semiconductor substrate 101. As a result, the sacrificial layer 133 is buried in each isolation trench $T_1$ via the protective layer 131 and the amorphous layer 132 in the first and third regions $R_1$ and $R_3$ (FIG. 14A). On the other hand, the sacrificial layer 133 is buried in each isolation trench $T_1$ via the protective layer 131 in the second region $R_2$ (FIG. 14B).

Next, as illustrated in FIGS. 15A and 15B, the CMP processing of the sacrificial layer 133 is performed using the CMP stopper 121 as a stopper to planarize the upper surface of the sacrificial layer 133. As a result, as illustrated in FIGS. 15A and 15B, the upper surface of the CMP stopper 121 is exposed.

Next, as illustrated in FIGS. 16A and 16B, the sacrificial layer 133 is etched to lower the upper surface of the sacrificial layer 133. At this time, the protective layer 131 and the amorphous layer 132 are desirably etched simultaneously with the etching of the sacrificial layer 133. The protective layer 131 and the amorphous layer 132 may be etched separately after the etching of the sacrificial layer 133.

Next, as illustrated in FIGS. 17A and 17B, the CMP stopper 121 is removed using a phosphoric acid solution. As a result, as illustrated in FIGS. 17A and 17B, the upper surface of the first electrode layer 112 is exposed.

Figure 18A:
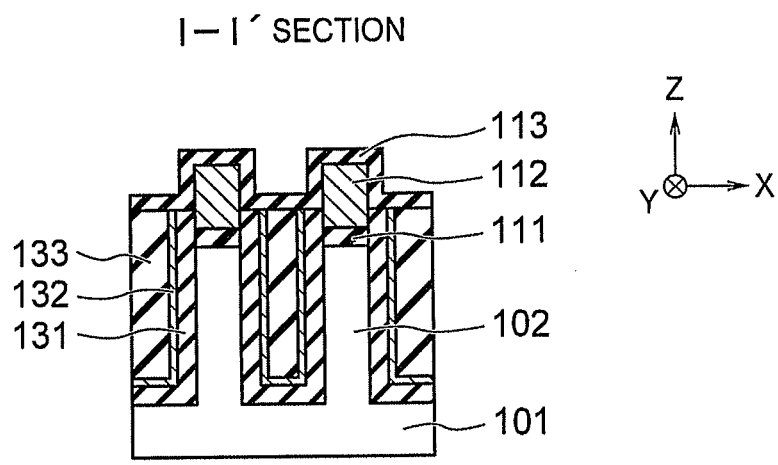
Figure 18B:
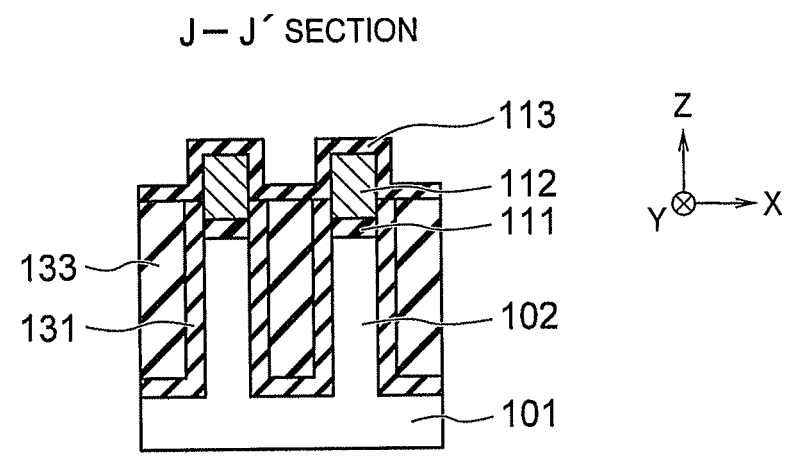

Next, as illustrated in FIGS. 18A and 18B, a second insulating layer 113 for forming the inter electrode insulator of a cell transistor is formed on the entire surface of the semiconductor substrate 101. As a result, the second insulating layer 113 is continuously formed on the upper surface and side surfaces of the first electrode layer 112 and on the upper surface of the sacrificial layer 133 in each isolation trench $T_1$.

Figure 19A:
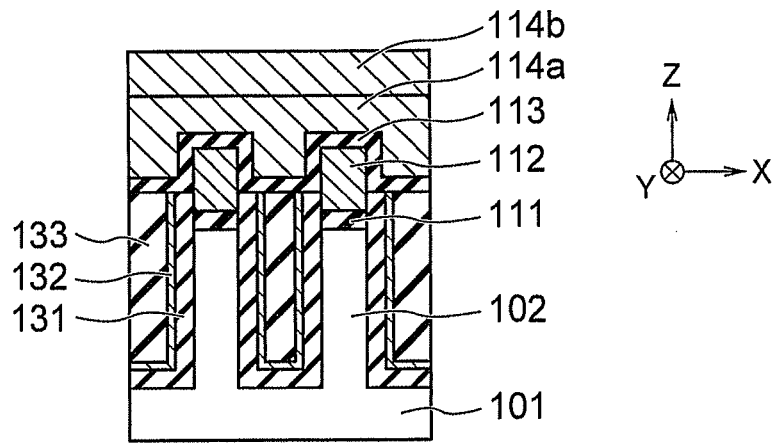
Figure 19B:
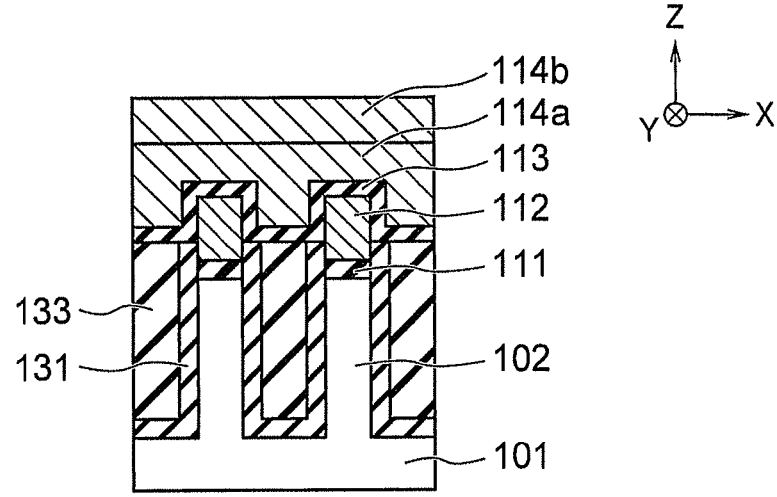

Next, as illustrated in FIGS. 19A and 19B, an lower layer 114a of the second electrode layer 114 for forming the control gate of the cell transistor and the gate electrode of the selection transistor is formed on the entire surface of the semiconductor substrate 101. As a result, the lower layer 114a of the second electrode layer 114 is formed on the second insulating layer 113.

Next, a resist layer (not illustrated) is coated on the entire surface of the semiconductor substrate 101. Next, the resist layer is patterned by exposure and development. Next, openings which penetrate the lower layer 114a and the second insulating layer 113 and reach the first electrode layer 112 are formed on the second-interconnect lower regions $R_{SG}$ by etching using the resist layer as a mask. Next, the resist layer is removed using a separating liquid.

Next, as illustrated in FIGS. 19A and 19B, an upper layer 114b of the second electrode layer 114 for forming the control gate of the cell transistor and the gate electrode of the selection transistor is formed on the entire surface of the semiconductor substrate 101. As a result, the upper layer 114b of the second electrode layer 114 is formed on the lower layer 114a of the second electrode layer 114. In addition, the first electrode layer 112 and the second electrode layer 114 on the second-interconnect lower regions $R_{SG}$ are electrically connected to each other through the above-mentioned openings.

Next, as illustrated in FIGS. 20A to 20F, a hard mask layer 202 is formed on the entire surface of the semiconductor substrate 101. FIG. 20A is a cross-sectional view corresponding to FIG. 19A, and FIGS. 20B and 20C are cross-sectional views taken along lines A-A' and B-B', respectively, shown in FIG. 20A. In addition, FIG. 20D is a cross-sectional view corresponding to FIG. 19B, and FIGS. 20E and 20F are cross-sectional views taken along lines A-A' and B-B', respectively, shown in FIG. 20D. The hard mask layer 202 is, for example, a silicon nitride layer and a TEOS layer.

Next, as illustrated in FIGS. 20A to 20F, a plurality of trenches $T_2$, $T_3$ and $T_4$ extending in the X direction are formed by photolithography and dry etching, so as to penetrate the second electrode layer 114, the second insulating layer 113 and the first electrode layer 112 and reach the first insulating layer 111. Each trench $T_2$ is located between word lines WL shown in FIG. 9. The trench $T_3$ is located between a word line WL and a selection gate SG. The trench $T_4$ is located between selection gates SG.

As the result of this processing, a plurality of cell transistors each including the gate insulator 111, the charge storage layer 112, the inter electrode insulator 113, and the control gate 114 are formed on the semiconductor substrate 101, as illustrated in FIG. 20C. In addition, a plurality of selection transistors each including the first insulating layer 111 which is a gate insulator and the first and second electrode layers 112 and 114 which are gate electrodes are formed on the semiconductor substrate 101, as illustrated in FIG. 20D.

As illustrated in FIGS. 20A to 20F, the second insulating layer 113 and the second electrode layer 114 are processed into a shape extending in the X direction. The second electrode layers 114 on the regions $R_{WL}$ serve as the word lines WL of the cell transistors, and the second electrode layers 114 on the regions $R_{SG}$ serve as the selection gates SG of the selection transistors. The word lines WL and the selection gates SG are examples of first and second interconnects, respectively.

Next, as illustrated in FIGS. 21A to 21F, the sacrificial layer 133 in each isolation trench $T_1$ is removed by isotropic etching. As a result, an air gap $AG_1$ extending in the Y direction is formed in each isolation trench $T_1$.

Figure 21A:
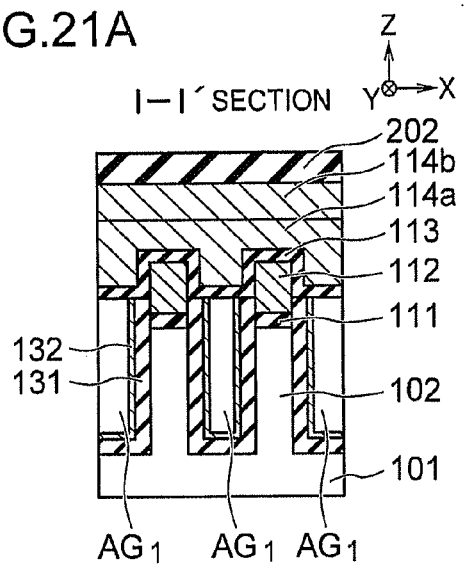
Figure 21D:
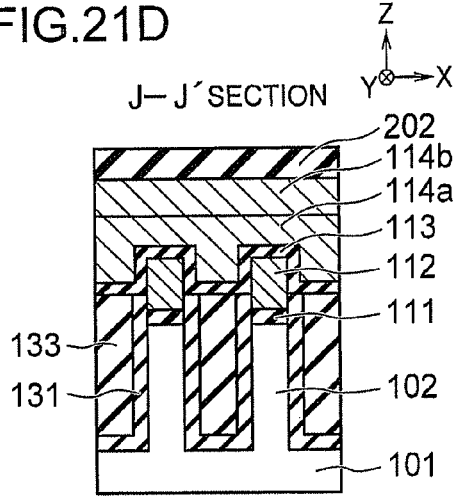
Figure 21B:
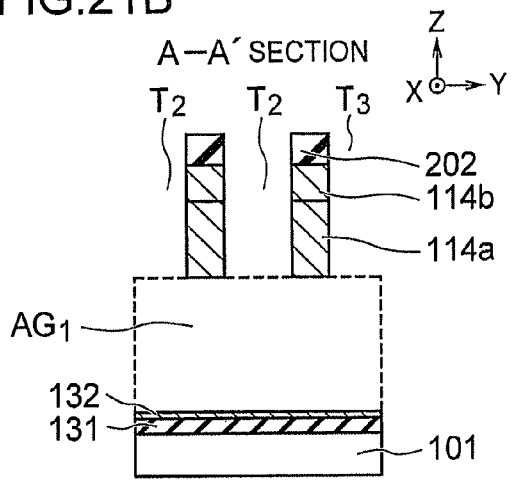
Figure 21E:
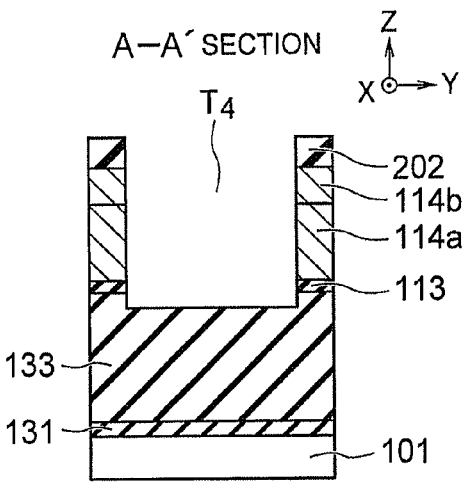
Figure 21C:
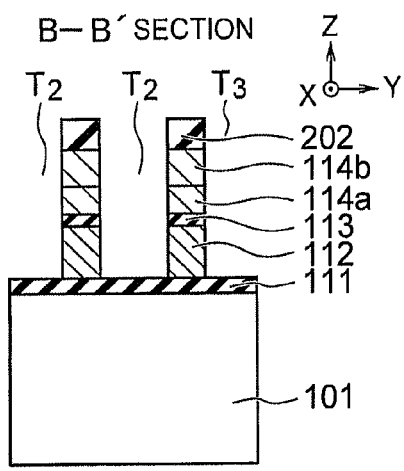
Figure 21F:
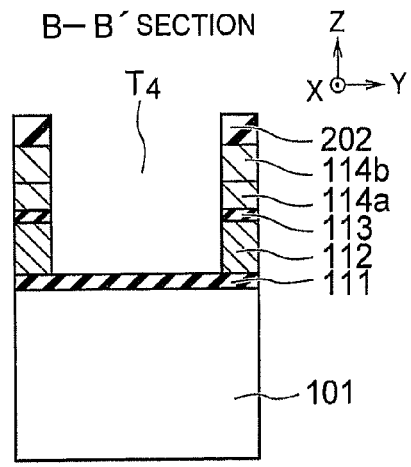
Figure 22A:
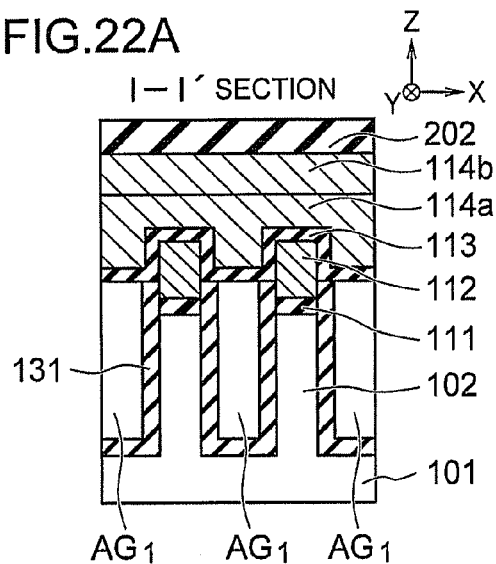
Figure 22D:
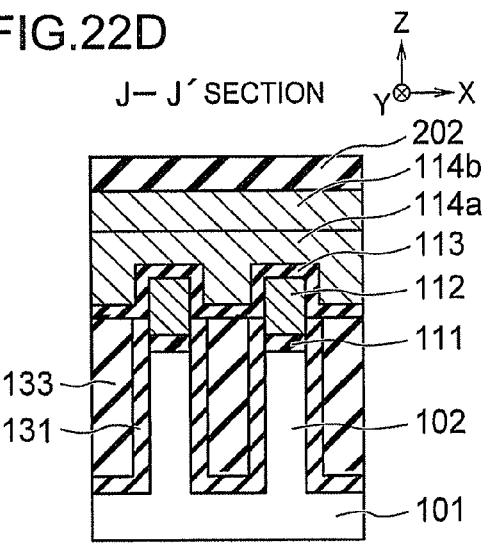
Figure 22B:
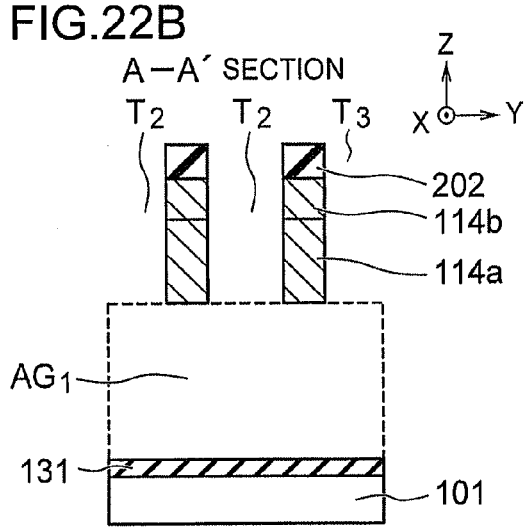
Figure 22E:
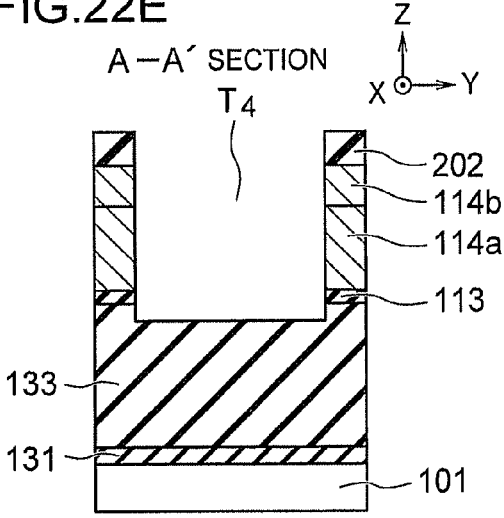
Figure 22C:
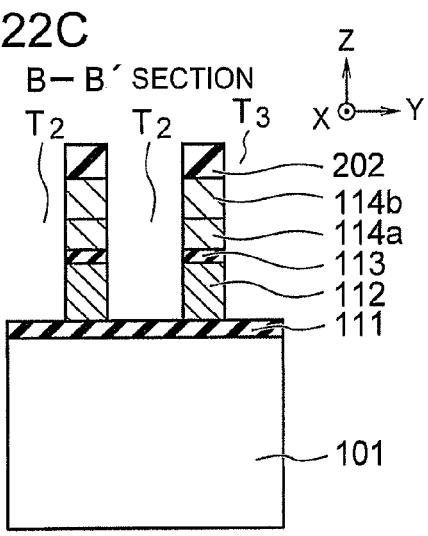
Figure 22F:
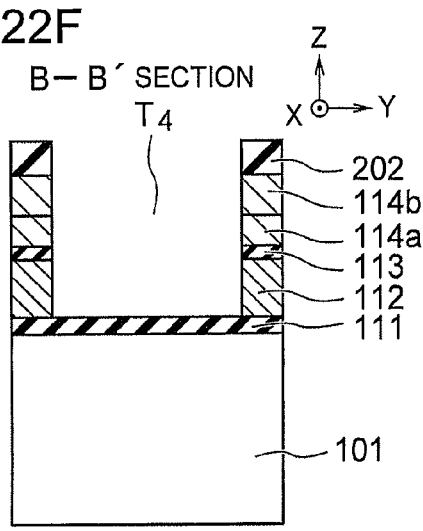
Figure 23A:
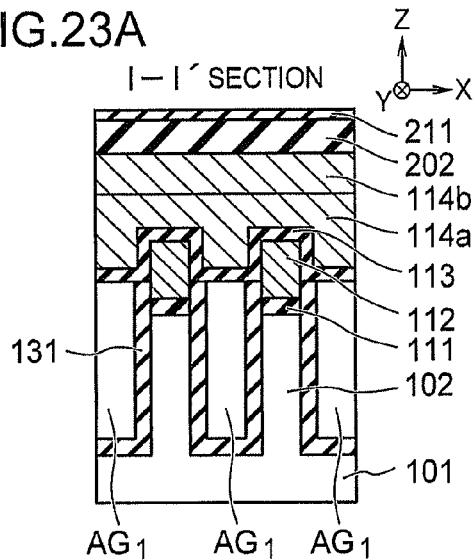
Figure 23D:
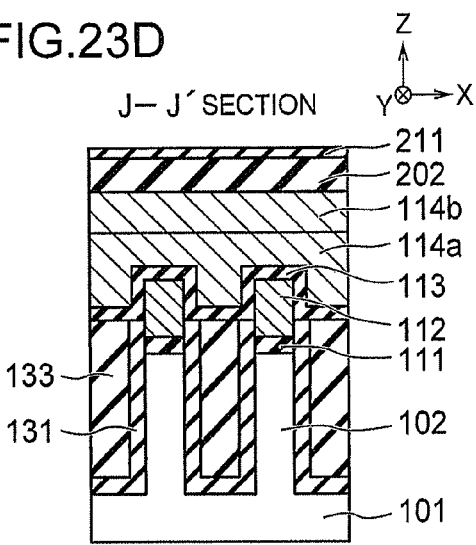
Figure 23B:
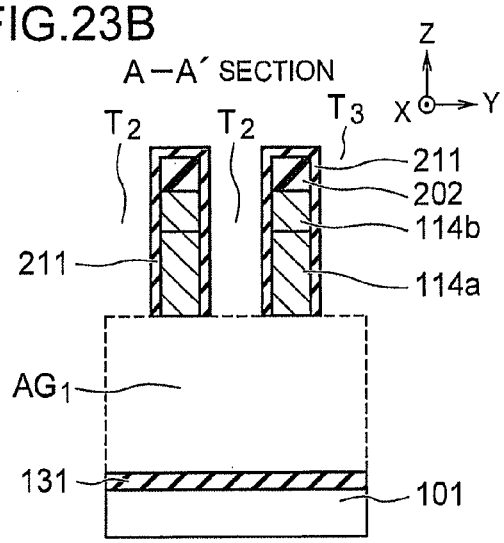
Figure 23E:
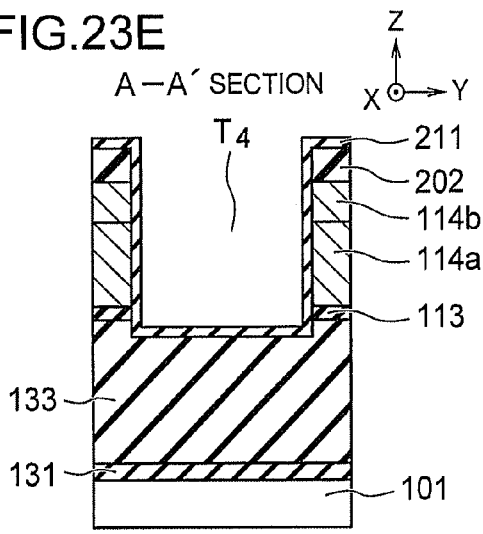
Figure 23C:
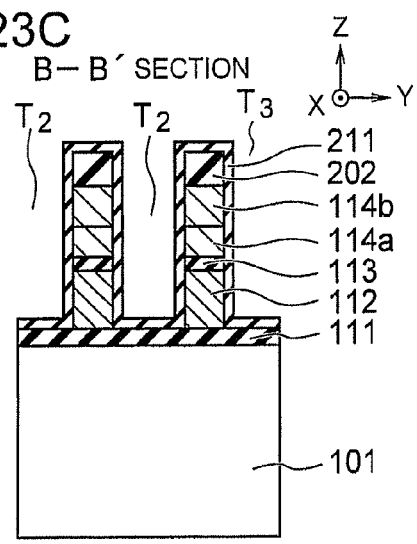
Figure 23F:
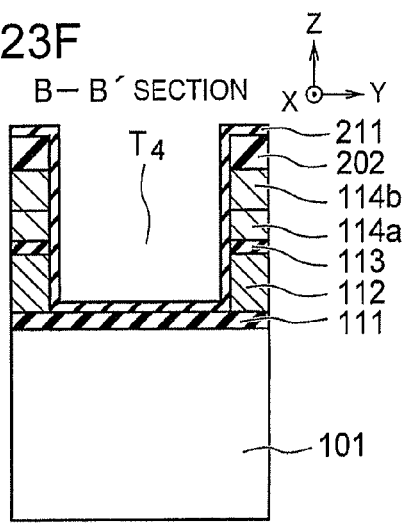
Figure 24A:
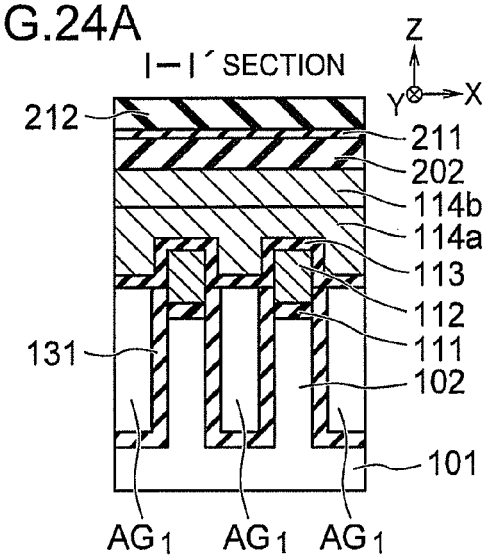
Figure 24D:
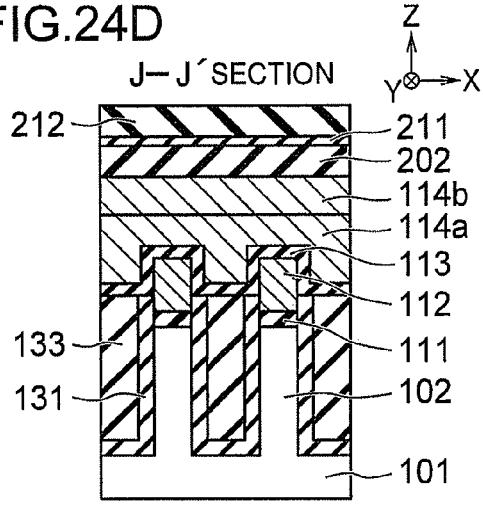
Figure 24B:
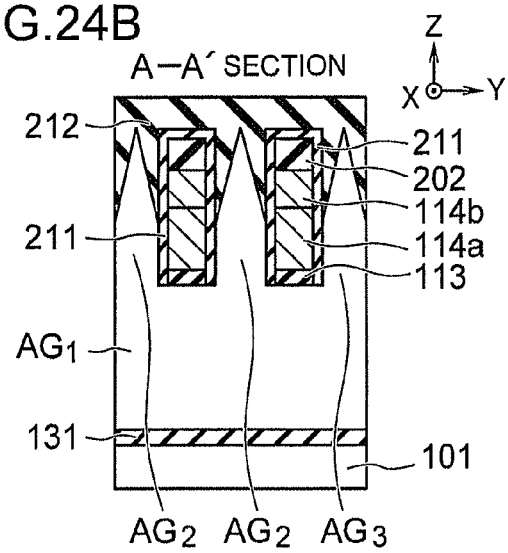
Figure 24E:
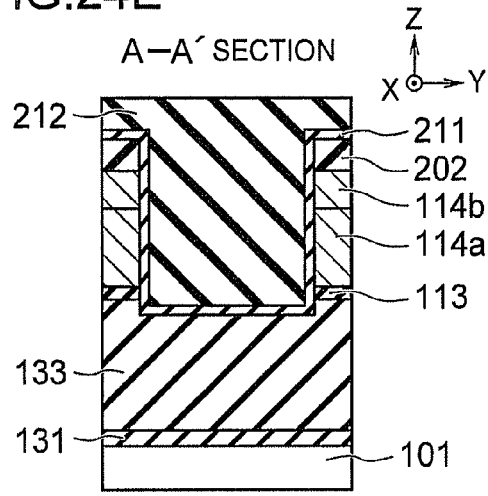
Figure 24C:
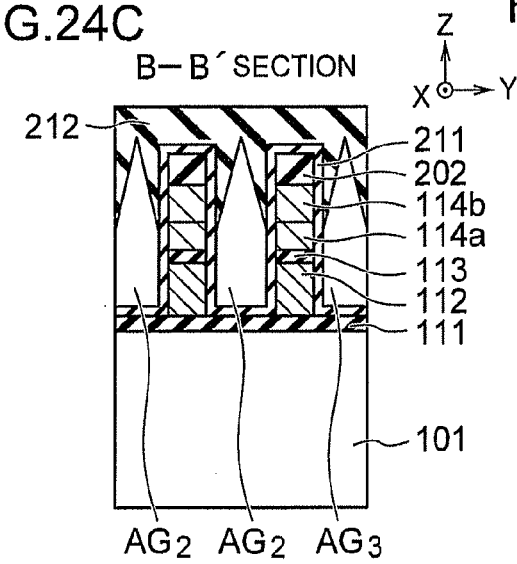
Figure 24F:
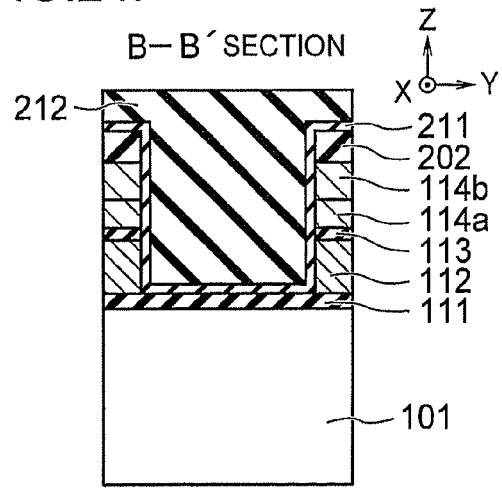

At this time, the sacrificial layer 133 is easily removed in a region in which the amorphous layer 132 is present, as illustrated in FIG. 21A to FIG. 21C. On the other hand, the sacrificial layer 133 is not easily removed in a region in which the amorphous layer 132 is not present, as illustrated in FIGS. 21D to 21F. The reason for this is that, as described above, the etching rate of the sacrificial layer 133 becomes faster, compared with a case where the amorphous layer 132 is not present, if a thin amorphous layer 132 is present on the sidewall surfaces of each isolation trench $T_1$.

The etching rate of the sacrificial layer 133 varies, depending on the amount of amorphous layer 132 attached to the sidewall surfaces of the isolation trench $T_1$ or the oxidizing temperature of the sacrificial layer 133. Accordingly, in the present embodiment, it is possible not to remove the sacrificial layer 133 almost at all and prevent air gaps $AG_1$ from being formed in a region where the amorphous layer 132 is not present, by adjusting the amount of the amorphous layer 132 or the oxidizing temperature of the sacrificial layer 133.

Therefore, in the present embodiment, the air gaps $AG_1$ are prevented from being formed in the second region $R_2$ by not forming the amorphous layer 132 in the second region $R_2$ (FIGS. 21D to 21F). In addition, in the present embodiment, the air gaps $AG_1$ are formed in the regions $R_1$, $R_3$ and $R_{WL}$ by forming the amorphous layer 132 in the regions $R_1$, $R_3$ and $R_{WL}$ (FIGS. 21A to 21C). The advantage of each air gap $AG_1$ having such a shape as described above will be described later.

Next, as illustrated in FIGS. 22A to 22F, the amorphous layer 132 in each isolation trench $T_1$ is removed using an alkaline solution. As a result, the amorphous layer 132 in each air gap $AG_1$ is removed.

Next, as illustrated in FIGS. 23A to 23F, a spacer insulator 211 is formed on the entire surface of the semiconductor substrate 101. As a result, the spacer insulator 211 is formed on the side surfaces and upper surfaces of each cell transistor and each selection transistor. The spacer insulator 211 is, for example, a silicon oxide layer and a silicon nitride layer formed by CVD. Next, ion implantation into the semiconductor substrate 101 is performed.

Next, as illustrated in FIGS. 24A to 24F, a cover layer 212 for forming the air gap $AG_2$ is formed on the entire surface of the semiconductor substrate 101. As a result, each air gap $AG_2$ is formed between word lines WL. In the present embodiment, an insulating layer superior in insulation properties and inferior in burial properties is used as the cover layer 212. The cover layer 212 is, for example, a silicon oxide layer, such as a plasma TEOS layer and a plasma $SiH_4$ layer, formed by CVD.

The air gap $AG_3$ between a word line WL and a selection gate SG and the air gap $AG_4$ between selection gates SG may be or may not be formed.

Here, a description will be given of the advantage of not forming the air gaps $AG_1$ in the second regions $R_2$.

In general, a width between the selection gates SG is set greater than a width between the word lines WL. In other words, the width of the second regions $R_2$ is set greater than the width of the first regions $R_1$.

Accordingly, if the air gaps $AG_1$ are present in the first and second regions $R_1$ and $R_2$, a CVD gas flows from the second regions $R_2$ into the air gaps $AG_1$ at the time of forming the spacer insulator 211 and the cover layer 212. These portions of the CVD gas go up from the air gaps $AG_1$ to a space between word lines WL, and fill the space. As a result, it is no longer possible to form an air gap $AG_2$ between the word lines WL.

Therefore, in the present embodiment, the air gaps $AG_1$ are prevented from being formed in the second regions $R_2$, as described above. Accordingly, it is possible to prevent the CVD gas from flowing into the air gaps $AG_1$ from the second regions $R_2$. Consequently, according to the present embodiment, the air gap $AG_2$ can be formed between the word lines WL.

In general, the width of the third regions $R_3$ is set greater than the width of the first regions $R_1$ but less than the width of the second regions $R_2$. Accordingly, the air gaps $AG_1$ are desirably formed in the third regions $R_3$, as in the present embodiment, if the ingress of the CVD gas from the third regions $R_3$ is not so problematic. Consequently, it is possible to increase the size of each air gap $AG_1$, compared with a case where the air gaps $AG_1$ are not formed in the third regions $R_3$.

In the present embodiment, an inter layer dielectric, a contact plug, a via plug, an interconnect layer and the like are then formed on the semiconductor substrate 101. In this way, the semiconductor device of the present embodiment is manufactured.

The sacrificial layer 133 and the amorphous layer 132 may respectively be left over partially in the removal of the sacrificial layer 133 in FIGS. 21A to 21F and in the removal of the amorphous layer 132 in FIGS. 22A to 22F. This is the same as in the modifications of the first embodiment.

(2) Modification of Second Embodiment

Next, a modification of the second embodiment will be described with reference to FIGS. 25 and 26.

Figure 25:
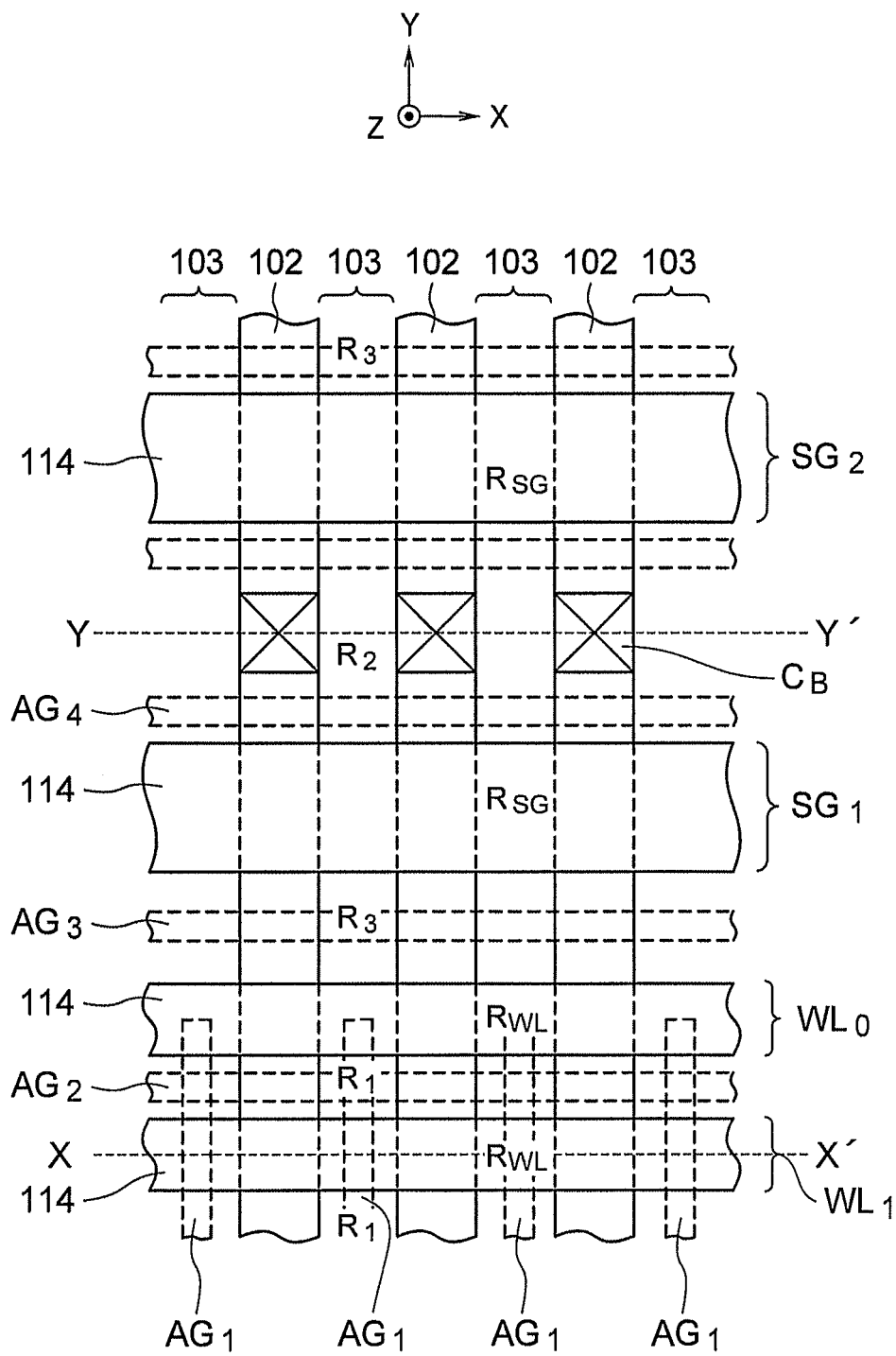
FIG. 25 is a plan view illustrating a structure of a semiconductor device according to a modification of the second embodiment.

FIG. 25 is a plan view illustrating a structure of a semiconductor device according to the modification of the second embodiment. In the present modification, air gaps $AG_1$ are continuously formed in regions $R_1$ and $R_{WL}$, but are not formed in regions $R_2$, $R_{SG}$ and $R_3$. As a result, the air gaps $AG_1$ are formed only in the first regions $R_1$ among the regions $R_1$ to $R_3$.

Figure 26:
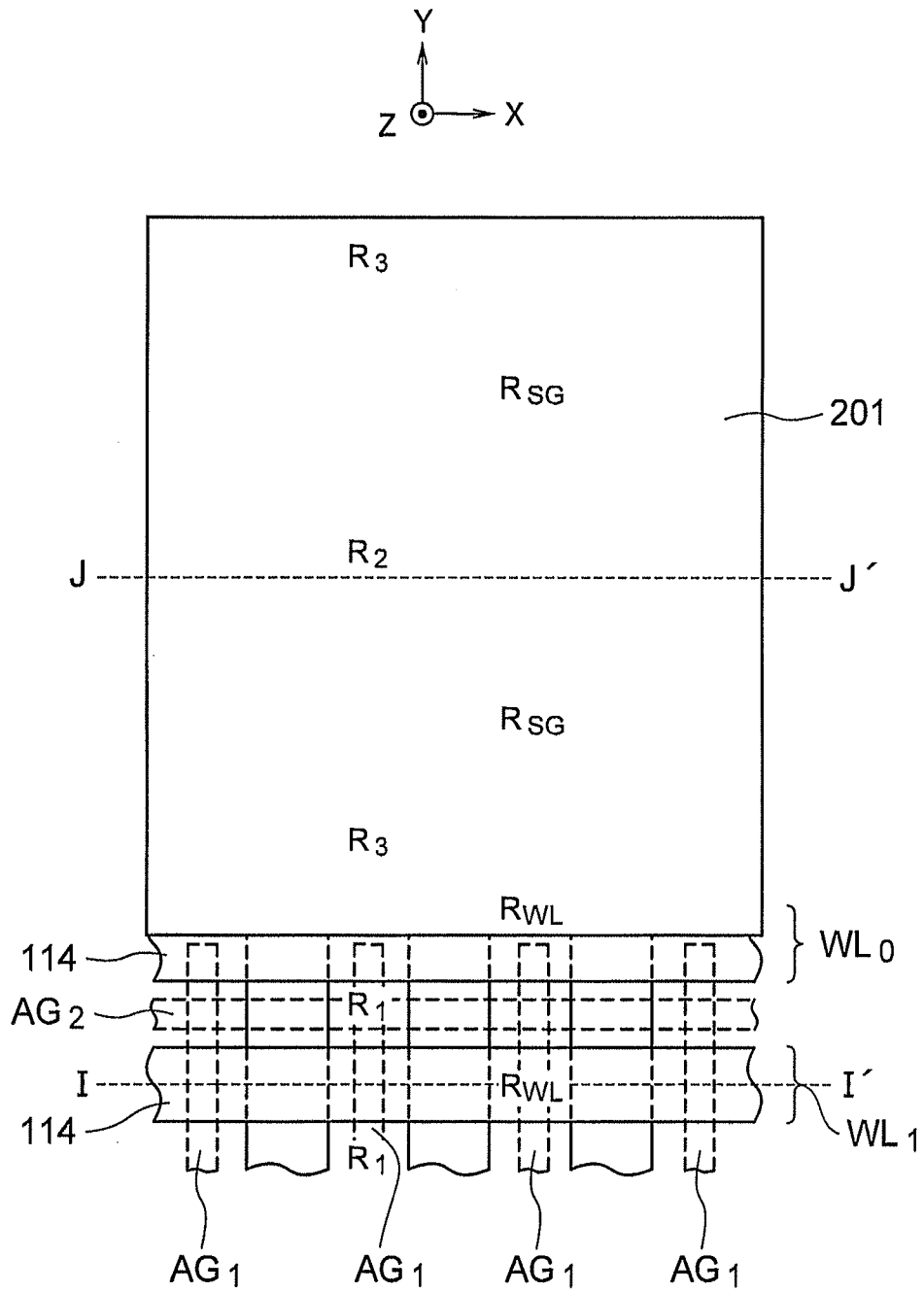
FIG. 26 is a plan view illustrating a method of manufacturing the semiconductor device according to the modification of the second embodiment.

Such a shape of the air gaps $AG_1$ can be formed by replacing the step illustrated in FIG. 12 with a step illustrated in FIG. 26. FIG. 26 is a plan view illustrating a method of manufacturing the semiconductor device according to the modification of the second embodiment. In the present modification, a resist layer 201 is patterned so as to cover the entire areas of the regions $R_2$, $R_{SG}$ and $R_3$ among the regions $R_1$, $R_2$, $R_3$, $R_{WL}$ and $R_{SG}$, as illustrated in FIG. 26.

According to the present modification, it is possible to prevent the air gaps $AG_1$ from being formed in the second and third regions $R_2$ and $R_3$. Consequently, it is possible to prevent the ingress of a CVD gas from the third regions $R_3$ into the air gaps $AG_1$.

(3) Effects of Second Embodiment

Finally, effects of the second embodiment will be described.

As described above, in the present embodiment, the air gaps $AG_1$ are prevented from being formed in the second regions $R_2$ by not forming the amorphous layer 132 in the second regions $R_2$ (regions in the semiconductor substrate 101 located between the selection gates SG). Consequently, according to the present embodiment, it is possible to prevent the ingress of a CVD gas from the second regions $R_2$ into the air gaps $AG_1$, and thereby forming the air gap $AG_2$ between word lines WL.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:
forming an isolation trench in a substrate;
forming an amorphous layer on a sidewall surface of the isolation trench;
forming a sacrificial layer in the isolation trench via the amorphous layer;
forming an air gap layer on the sacrificial layer; and
forming an air gap in the isolation trench under the air gap layer by removing the sacrificial layer and the amorphous layer after forming the air gap layer.

2. The method of claim 1, wherein the removal of the sacrificial layer removes the sacrificial layer in whole or in part.

3. The method of claim 1, wherein the removal of the amorphous layer removes the amorphous layer in whole or in part.

4. The method of claim 1, wherein the amorphous layer is formed on the sidewall surface of the isolation trench via a protective layer.

5. The method of claim 4, wherein a thickness of the protective layer on the sidewall surface of the isolation trench is 1 to 20 nm.

6. The method of claim 4, wherein the protective layer is an oxide layer.

7. The method of claim 1, wherein a thickness of the amorphous layer is 5 nm or less.

8. The method of claim 1, wherein the amorphous layer contains at least silicon.

9. The method of claim 1, wherein a thickness of the isolation trench is 30 nm or less.

10. The method of claim 1, wherein the sacrificial layer is formed by oxidizing a sacrificial layer material.

11. The method of claim 10, wherein the sacrificial layer material is formed of perhydropolysilazane or hydrogen silsesquioxane.

12. The method of claim 10, wherein the sacrificial layer material is oxidized at 230° C. or higher.

13. The method of claim 1, wherein
the isolation trench is formed after a first insulating layer for forming a gate insulator and a first electrode layer for forming a charge storage layer are successively formed on the substrate;
the air gap layer is a second insulating layer for forming an inter electrode insulator; and
the air gap is formed after a second electrode layer for forming a control gate is formed on the second insulating layer; and
a plurality of cell transistors and a plurality of selection transistors are formed on the substrate by using the first insulating layer, the first electrode layer, the second insulating layer, and the second electrode layer.

14. The method of claim 13, wherein
the air gap is processed into a shape extending in a first direction parallel to a principal surface of the substrate; and
the second electrode layers of the cell transistors and the selection transistors are processed to be first and second interconnects extending in a second direction perpendicular to the first direction, respectively.

15. The method of claim 14, wherein the air gap is formed only in a first region located between the first interconnects in the substrate, among the first region located between the first interconnects in the substrate and a second region located between the second interconnects in the substrate.

16. The method of claim 15, wherein the air gap is also formed in a third region located between a first interconnect and a second interconnect in the substrate.

17. The method of claim 15, wherein the air gap is not formed in a third region located between a first interconnect and a second interconnect in the substrate.

18. The method of claim 15, wherein the air gap is continuously formed in the first region located between the first interconnects in the substrate and in a first-interconnect lower region located under a first interconnect in the substrate.

19. The method of claim 14, wherein the amorphous layer is formed only in a first region located between the first interconnects in the substrate, among the first region located between the first interconnects in the substrate and a second region located between the second interconnects in the substrate.

20. A method of manufacturing a semiconductor device, the method comprising:
forming an isolation trench in a substrate;
forming an amorphous layer on a sidewall surface of the isolation trench;
forming a sacrificial layer in the isolation trench via the amorphous layer, the sacrificial layer being formed by oxidizing a sacrificial layer material;
forming an air gap layer on the sacrificial layer; and
forming an air gap in the isolation trench under the air gap layer by removing the sacrificial layer after forming the air gap layer.

21. The method of claim 20, wherein the removal of the sacrificial layer removes the sacrificial layer in whole or in part.

22. The method of claim 20, wherein the removal of the amorphous layer removes the amorphous layer in whole or in part.

23. The method of claim 20, wherein the amorphous layer is formed on the sidewall surface of the isolation trench via a protective layer.

24. The method of claim 23, wherein a thickness of the protective layer on the sidewall surface of the isolation trench is 1 to 20 nm.

25. The method of claim 23, wherein the protective layer is an oxide layer.

26. The method of claim 20, wherein a thickness of the amorphous layer is 5 nm or less.

27. The method of claim 20, wherein the amorphous layer contains at least silicon.

28. The method of claim 20, wherein a thickness of the isolation trench is 30 nm or less.

29. The method of claim 20, wherein the sacrificial layer material is formed of perhydropolysilazane or hydrogen silsesquioxane.

30. The method of claim 20, wherein the sacrificial layer material is oxidized at 230° C. or higher.

31. The method of claim 20, wherein
the isolation trench is formed after a first insulating layer for forming a gate insulator and a first electrode layer for forming a charge storage layer are successively formed on the substrate;
the air gap layer is a second insulating layer for forming an inter electrode insulator; and
the air gap is formed after a second electrode layer for forming a control gate is formed on the second insulating layer; and
a plurality of cell transistors and a plurality of selection transistors are formed on the substrate by using the first insulating layer, the first electrode layer, the second insulating layer, and the second electrode layer.

32. The method of claim 31, wherein
the air gap is processed into a shape extending in a first direction parallel to a principal surface of the substrate; and
the second electrode layers of the cell transistors and the selection transistors are processed to be first and second interconnects extending in a second direction perpendicular to the first direction, respectively.

33. The method of claim 32, wherein the air gap is formed only in a first region located between the first interconnects in the substrate, among the first region located between the first interconnects in the substrate and a second region located between the second interconnects in the substrate.

34. The method of claim 33, wherein the air gap is also formed in a third region located between a first interconnect and a second interconnect in the substrate.

35. The method of claim 33, wherein the air gap is not formed in a third region located between a first interconnect and a second interconnect in the substrate.

36. The method of claim 33, wherein the air gap is continuously formed in the first region located between the first interconnects in the substrate and in a first-interconnect lower region located under a first interconnect in the substrate.

37. The method of claim 32, wherein the amorphous layer is formed only in a first region located between the first interconnects in the substrate, among the first region located between the first interconnects in the substrate and a second region located between the second interconnects in the substrate.

38. A method of manufacturing a semiconductor device, the method comprising:
forming an isolation trench in a substrate after a first insulating layer for forming a gate insulator and a first electrode layer for forming a charge storage layer are successively formed on the substrate;
forming an amorphous layer on a sidewall surface of the isolation trench;
forming a sacrificial layer in the isolation trench via the amorphous layer;
forming an air gap layer on the sacrificial layer, the air gap layer being a second insulating layer for forming an inter electrode insulator;
forming a second electrode layer for forming a control gate on the second insulating layer;
forming an air gap in the isolation trench under the second insulating layer by removing the sacrificial layer after forming the second insulating layer and the second electrode layer; and
forming cell transistors and selection transistors on the substrate by using the first insulating layer, the first electrode layer, the second insulating layer, and the second electrode layer.

39. The method of claim 38, wherein the removal of the sacrificial layer removes the sacrificial layer in whole or in part.

40. The method of claim 38, wherein the removal of the amorphous layer removes the amorphous layer in whole or in part.

41. The method of claim 38, wherein the amorphous layer is formed on the sidewall surface of the isolation trench via a protective layer.

42. The method of claim 41, wherein a thickness of the protective layer on the sidewall surface of the isolation trench is 1 to 20 nm.

43. The method of claim 41, wherein the protective layer is an oxide layer.

44. The method of claim 38, wherein a thickness of the amorphous layer is 5 nm or less.

45. The method of claim 38, wherein the amorphous layer contains at least silicon.

46. The method of claim 38, wherein a thickness of the isolation trench is 30 nm or less.

47. The method of claim 38, wherein
the air gap is processed into a shape extending in a first direction parallel to a principal surface of the substrate; and
the second electrode layers of the cell transistors and the selection transistors are processed to be first and second interconnects extending in a second direction perpendicular to the first direction, respectively.

48. The method of claim 47, wherein the air gap is formed only in a first region located between the first interconnects in the substrate, among the first region located between the first interconnects in the substrate and a second region located between the second interconnects in the substrate.

49. The method of claim 48, wherein the air gap is also formed in a third region located between a first interconnect and a second interconnect in the substrate.

50. The method of claim 48, wherein the air gap is not formed in a third region located between a first interconnect and a second interconnect in the substrate.

51. The method of claim 48, wherein the air gap is continuously formed in the first region located between the first interconnects in the substrate and in a first-interconnect lower region located under a first interconnect in the substrate.

52. The method of claim 47, wherein the amorphous layer is formed only in a first region located between the first interconnects in the substrate, among the first region located between the first interconnects in the substrate and a second region located between the second interconnects in the substrate.

* * * * *